(12) United States Patent
Chiu

(10) Patent No.: US 12,315,578 B2
(45) Date of Patent: May 27, 2025

(54) SEMICONDUCTOR DEVICE WITH PROGRAMMABLE FEATURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 558 days.

(21) Appl. No.: 17/838,448

(22) Filed: Jun. 13, 2022

(65) Prior Publication Data

US 2023/0402114 A1    Dec. 14, 2023

(51) Int. Cl.
G11C 17/16    (2006.01)
H01L 23/525   (2006.01)
H10B 20/25    (2023.01)

(52) U.S. Cl.
CPC .......... *G11C 17/16* (2013.01); *H01L 23/5252* (2013.01); *H10B 20/25* (2023.02)

(58) Field of Classification Search
CPC ...... G11C 17/16; H01L 23/5252; H10B 20/25
See application file for complete search history.

(56) References Cited

U.S. PATENT DOCUMENTS

| | | | |
|---|---|---|---|
| 2004/0023440 A1 | 2/2004 | Ito et al. | |
| 2009/0008742 A1* | 1/2009 | Okayama | H10B 20/25 257/530 |
| 2011/0108926 A1 | 5/2011 | Bahl | |
| 2014/0299889 A1* | 10/2014 | Cho | H10D 84/0133 257/77 |
| 2019/0172948 A1* | 6/2019 | Paul | H01L 21/743 |
| 2019/0393039 A1 | 12/2019 | Wang | |
| 2020/0212176 A1 | 7/2020 | Koshimizu et al. | |
| 2020/0235107 A1 | 7/2020 | Goktepeli et al. | |

(Continued)

FOREIGN PATENT DOCUMENTS

| | | |
|---|---|---|
| TW | 202205133 A | 2/2022 |
| WO | WO2020014859 A1 | 1/2020 |

OTHER PUBLICATIONS

Office Action dated on Jul. 6, 2023 related to Taiwanese Application No. 111137286.

(Continued)

*Primary Examiner* — Vongsavanh Sengdara
(74) *Attorney, Agent, or Firm* — Xuan Zhang

(57) ABSTRACT

The present application provides a semiconductor device. The semiconductor device includes a substrate, a first insulative film, a second insulative film, a first electrode, a second electrode, a capping layer, a plurality of first impurity regions and a plurality of second impurity regions. The first insulative film is disposed on the substrate. The second insulative film at least partially surrounds the first insulative film. The first electrode and the capping layer, covering the first electrode, are disposed on the first insulative film. The second electrode is disposed over the second insulative film and covers the capping layer. The first and second impurity regions are disposed in the substrate. Each of the first impurity regions extends under and across the second electrode and the first electrode. The second impurity regions are exposed through the second insulative film and the second electrode.

19 Claims, 23 Drawing Sheets

(56) References Cited

U.S. PATENT DOCUMENTS

2021/0272893 A1    9/2021  Song et al.
2021/0351192 A1*  11/2021  Matloubian .......... G11C 17/165

OTHER PUBLICATIONS

Office Action dated on Sep. 21, 2023 related to Taiwanese Application No. 111137286.
Office Action and and the search report mailed on Nov. 29, 2024 related to U.S. Appl. No. 17/838,726.

* cited by examiner

SEMICONDUCTOR DEVICE WITH PROGRAMMABLE FEATURE

TECHNICAL FIELD

The present disclosure relates to a semiconductor device, and more particularly, to a semiconductor device with an electrically programmable fuse (e-fuse).

DISCUSSION OF THE BACKGROUND

Electrically programmable fuse (e-fuse) devices are one-time-programmable (OTP) storage devices widely used in semiconductor devices to record customized data (e.g., a chip ID or a serial number) or repair defective elements inevitably remaining in integrated circuits due to semiconductor processes. As the e-fuse apparatuses become essential components of integrated circuits, optimizing design of the e-fuse device becomes increasingly important to circuit designers.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a first insulative film, a second insulative film, a first electrode, a capping layer, a second electrode, a plurality of first impurity regions, and a plurality of second impurity regions. The first insulative film is disposed on the substrate, and the second insulative film at least partially surrounds the first insulative film. The first electrode is disposed on the first insulative film. The capping layer is disposed over the first insulative film and covers the first electrode. The second electrode covers the capping layer and is disposed over the second insulative film. The plurality of first impurity regions are disposed in the substrate and under the first insulative film and the second insulative film, wherein each of the first impurity regions extends under and across the first electrode and the second electrode. The plurality of second impurity regions are disposed in the substrate and exposed through the second insulative film and the second electrode.

In some embodiments, the semiconductor device further includes a plurality of doped extension regions disposed in the substrate and contacting the second insulative film, wherein each of the doped extension regions is separated from an adjacent first impurity region by a channel region.

In some embodiments, the channel region has a length, and the plurality of first impurity regions are spaced apart from each other by a distance less than the length.

In some embodiments, the first electrode has a width less than the length.

In some embodiments, the plurality of first impurity regions and the plurality of doped extension regions have a same doping concentration.

In some embodiments, the plurality of first impurity regions, the plurality of second impurity regions, and the plurality of doped extension regions comprise n-type dopant species.

In some embodiments, the semiconductor device further includes a plurality of halo implants arranged within the substrate and under the plurality of doped extension regions, respectively.

In some embodiments, the semiconductor device further includes an isolation structure arranged within the substrate to define an active area where the plurality of first impurity regions, the plurality of second impurity regions, the plurality of doped extension regions, and the plurality of halo implants are disposed, wherein the first electrode and the second electrode extend across the active area and the isolation structure.

In some embodiments, the first insulative film has a first thickness, and the second insulative film has a second thickness greater than the first thickness.

In some embodiments, the first insulative film and the second insulative film are thermally-grown silicon oxide films.

In some embodiments, the first electrode has a width, the capping layer attached to the first electrode has a third thickness less than the width, and the second electrode has a fourth thickness less than the width.

In some embodiments, the width is about 2 to 3 times the fourth width.

In some embodiments, the width is in a range of about 30 to 100 nm.

In some embodiments, the third thickness is in a range of 2 to 3 nm.

In some embodiments, the semiconductor device further includes a plurality of spacers surrounding the second electrode.

In some embodiments, the semiconductor device further includes a passivation layer, a plurality of conductive plugs and a conductive wire; the passivation layer covers the plurality of second impurity regions, the spacers and the second electrode, and the plurality of conductive plugs penetrate through the passivation layer and contact the plurality of second impurity regions, respectively. The conductive wire is disposed on the passivation layer and contacts the plurality of conductive plugs.

In some embodiments, the plurality of first impurity regions have a first doping concentration, and the plurality of second impurity regions have a second doping concentration greater than the first doping concentration.

In some embodiments, the first electrode, the first insulative film and the plurality of first impurity regions form a pair of antifuses electrically connected in series, and the plurality of first impurity regions, the second electrode, the plurality of second insulative films and the plurality of second impurity regions form a pair of transistors electrically coupled to the pair of antifuses, respectively.

In some embodiments, the plurality of first impurity regions have a first depth, and the plurality of second impurity regions have a second depth greater than the first depth.

In some embodiments, the first and second electrodes include doped polysilicon.

One aspect of the present disclosure provides a method of fabricating a semiconductor device. The method includes steps of forming a first insulative film on a substrate; forming a first electrode on the first insulative film; implanting dopants in the substrate to form a plurality of first impurity regions on either side of the first electrode; depositing a capping layer to cover the first electrode; forming a second insulative film on portions of the substrate exposed through the first electrode and the capping layer; forming a second electrode disposed over the capping layer and portions of the second insulative film; removing portions of the second insulative film on either side of the second electrode; and implanting dopants in portions of the substrate exposed by the second insulative film to form a plurality of second impurity regions.

In some embodiments, the method further includes a step of forming a plurality of spacers on sidewalls of the second electrode, wherein the portions of second insulative film are etched using the second electrode and the spacers as a mask.

In some embodiments, the formation of the plurality of spacers includes steps of depositing a spacer layer on the substrate and second electrode; and performing an anisotropic etching process to remove the spacer layer from horizontal surfaces.

In some embodiments, the method further includes a step of forming a plurality of doped extension regions in portions of the substrate prior to the formation of the plurality of spacers using the second electrode as a mask.

In some embodiments, the method further includes a step of doping the substrate with halo implants prior to the formation of the plurality of spacers.

In some embodiments, the halo implants are formed on either side of the second electrode and are more deeply submerged within the substrate than the plurality of doped extension regions.

In some embodiments, the method further includes steps of depositing a dielectric layer on the substrate, the capping layer and the second conductive layer; forming a plurality of trenches in the dielectric layer to expose the plurality of second impurity regions; and depositing a conductive material in the plurality of trenches.

In some embodiments, the formation of the first electrode includes steps of depositing an electrode material on the first insulative film, and patterning the electrode material with a first electrode pattern using an anisotropic etching process.

In some embodiments, the method further includes a step of forming an isolation structure in the substrate to define an active region prior to the formation of the first insulative film.

In some embodiments, the first insulative film and the second insulative film are respectively formed using a thermal oxidation process.

With the above-mentioned configurations of semiconductor device, the second electrode, the first impurity regions and the second impurity regions designed as transistors are electrically connected in parallel, and the second electrode is disposed over the first electrode, so that the current for blowing the semiconductor device can increase while applying the same programming voltage.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
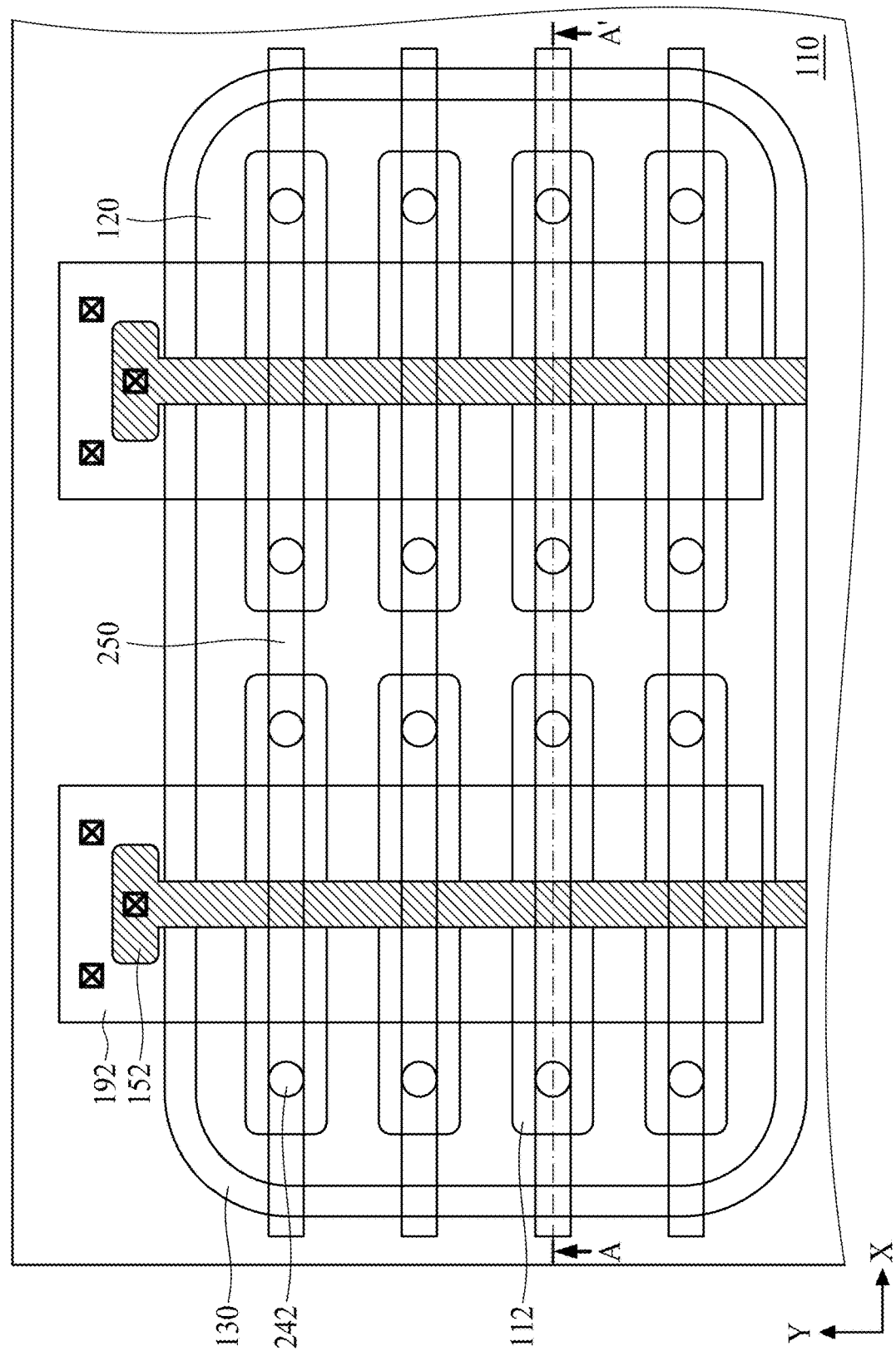
FIG. 1 is a plan view of a semiconductor device in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
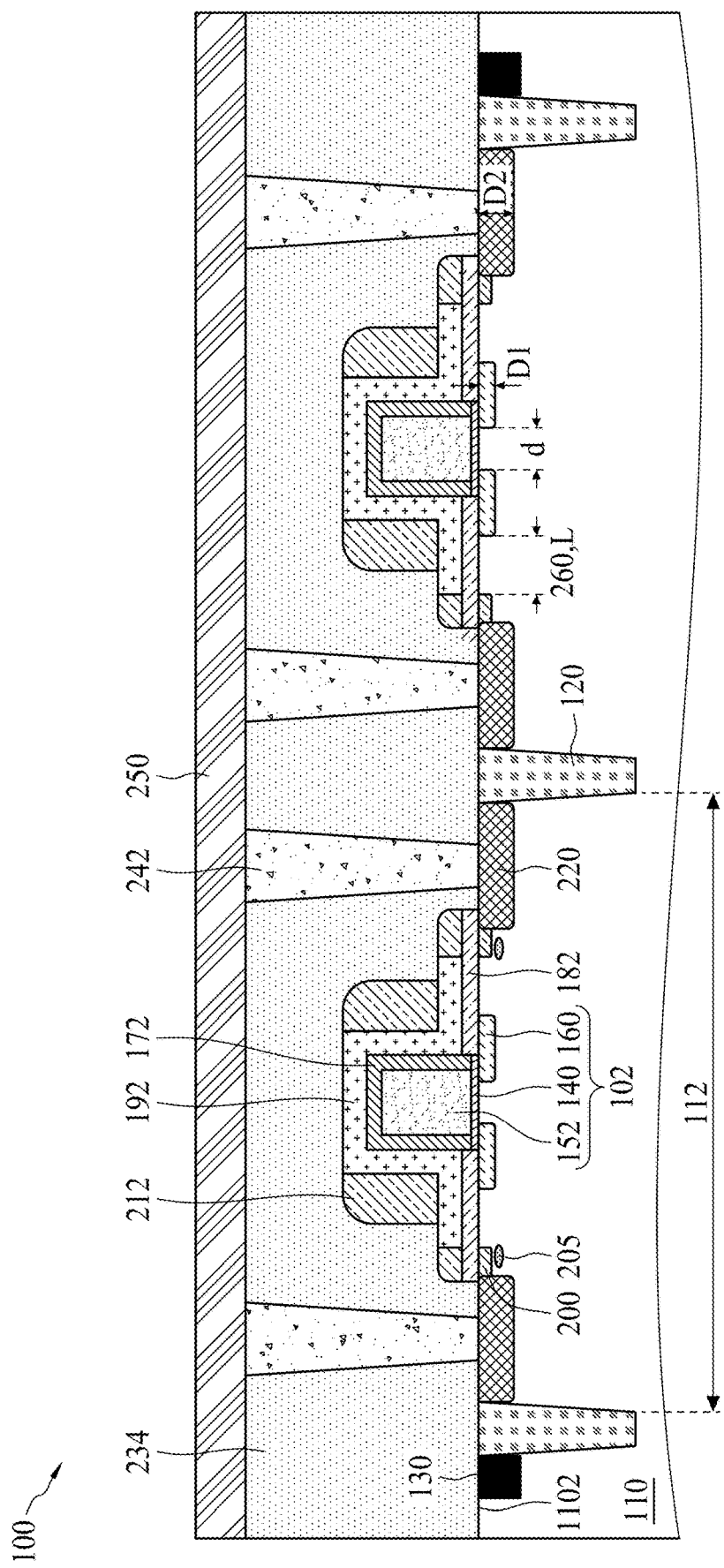
FIG. 2 is a cross-sectional view taken along a line A-A' in FIG. 1.

FIG. 1 is a plan view of a semiconductor device 10 in accordance with some embodiments of the present disclosure, and FIG. 2 is a cross-sectional view taken along a line A-A' in FIG. 1. Referring to FIGS. 1 and 2, the semiconductor device 10 is an electrically programmable device and includes a plurality of one-time programmable (OTP) elements 100 arranged in rows and columns. The OTP element 100, such as an electrical fuse, can be programmed by applying a high voltage to induce a current of sufficient magnitude to flow through the OTP element 100.

Figure 3:
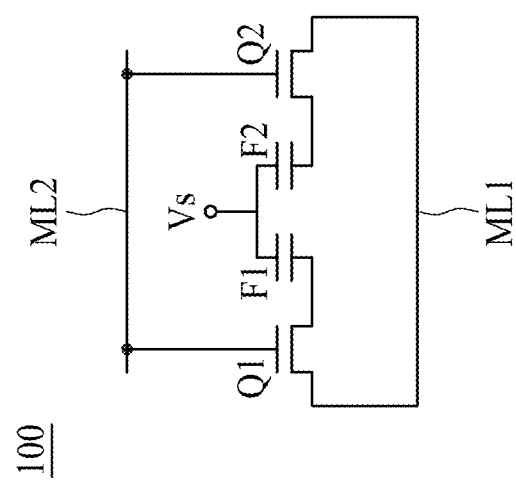
FIG. 3 is a schematic view of a two-transistor, two-antifuse one-time programmable element in accordance with some embodiments of the present disclosure.

Each of the OTP elements 100 has a two-transistor, two-antifuse architecture as schematically shown in FIG. 3. The two transistors of the OTP element 100 are labeled as Q1 and Q2, and the two antifuses, used as programmable features, are labeled as F1 and F2. The antifuses F1 and F2 are capacitor-like features. The transistor Q1 has a drain electrode connected to a node of the antifuse F1 and a source electrode connected to a first metal line ML1. Similarly, the transistor Q2 has a drain electrode connected to a node of the antifuse F2 and a source electrode connected to the first metal line ML1. Gate electrodes of the first and second transistors Q1 and Q2 are connected to a second metal line ML2, and each of the antifuses F1 and F2 has a node supplied with a suitable voltage Vs.

Referring again to FIGS. 1 and 2, the semiconductor device 10 includes a substrate 110 and at least one isolation feature 120 arranged in the substrate 110, thereby defining a plurality of active regions 112 where the OTP elements 100 are disposed. The OTP elements 100 are arranged in the active regions 112 extending in a first direction X, respectively. The isolation feature 120 can be a shallow trench isolation (STI) feature and serves to electrically isolate the OTP elements 100 formed in or on the substrate 110 from each other.

Each of the OTP elements 100 includes a first insulative film 140, a first electrode 152, a plurality of first impurity regions 160, a capping layer 172, a second insulative film 182, a second electrode 192, and a plurality of second impurity regions 220. The first insulative film 140 is disposed on the substrate 110. The first electrode 152, disposed on the first insulative film 140, extends longitudinally in a second direction Y and across the active regions 112. As illustrated in FIG. 1, the first direction X is orthogonal to the second direction Y.

The capping layer 172 is disposed over the first insulative film 140 and covers the first electrode 152. In an unprogrammed state, the first electrode 152 is electrically isolated from the substrate 110 by the first insulative film 140, wherein the substrate 110 has a first conductivity type. The first impurity regions 160 are arranged within the substrate 110 and spaced apart from each other by a distance d. The first impurity regions 160 can have a second conductivity type. For example, the first conductivity type may be p-type, and the second conductivity type may be n-type.

The second insulative film 182 is disposed on the substrate 110 and at least partially surrounds the first insulative film 140. Typically, the thermally-grown oxides can include a higher level of purity than the deposited oxides. To increase in the reliability of the semiconductor device 10, the first and second insulative films 140 and 182 are films of silicon dioxide grown on a surface 1102 of the substrate 110. The second insulative film 140 can have a thickness greater than that of the first insulative film 182 to sustain higher voltage.

Still referring to FIG. 2, the second electrode 192 covers the capping layer 172 and is disposed over the second insulative film 182. In other words, the second electrode 192 is electrically isolated from the first electrode 152 by the capping layer 172. The first and second electrodes 152 and 192 may include doped polysilicon. The second impurity regions 220 are disposed in the substrate 110 and exposed through the second insulative film 182 and the second electrode 192. The second impurity regions 220 are in contact with the surface 1102 of the substrate 110. The second impurity regions 220 may have the second conductivity type. The first impurity regions 160 have a first doping concentration, and the second impurity regions 220 have a second doping concentration greater than the first doping concentration. In addition, the first impurity regions 160 have a first depth D1, and the second impurity regions 220 have a second depth D2 greater than the first depth D1.

Referring to FIGS. 2 and 3, the first electrode 152, the first insulative film 140 and the plurality of first impurity regions 160 form the programmable features 102 (i.e., the antifuses F1 and F2), wherein each of the programmable features 102 comprises the first electrode 152, the first insulative film 140 and one of the first impurity regions 160. In addition, the plurality of first impurity regions 160, the second electrode 192, the second insulative film 182 and the plurality of second impurity regions 220 form the transistors Q1 and Q2 electrically coupled to the antifuses F1 and F2, respectively. The second electrode 192 forms gate electrodes of the first and second transistors Q1 and Q2, the first impurity regions 160 serve as drain regions of the transistors Q1 and Q2, and the second impurity regions 220 serve as source regions of the transistors Q1 and Q2. When a high voltage is applied to the second impurity region 220 and if the first and second transistors Q1 and Q2 are activated, the first insulative film 140 is broken and shorted.

Referring again to FIG. 2, the OTP element 100 may further include a plurality of doped extension regions 200 and a plurality of halo implants 205 disposed in the substrate 110. Portions of the doped extension regions 200 contact the second insulative film 182, and each of the halo implants 205 is arranged under one of the doped extension regions 200. Each of the doped extension regions 200 is separated from the adjacent first impurity region 160 by a channel region 260. The channel region 260 can have a length L, wherein the length L is greater than the distance d between the first impurity regions 160. The doped extension regions 200 are lightly doped regions introduced into the substrate 110 by ion implantation using the second electrode 192 as an implant mask.

The halo implants 205 are buried regions and act as depletion stopping layer, slowing down the grown of the depletion region when a voltage applied to the gate electrodes of the transistors Q1 and Q2 increases. In some embodiments, the halo implants 205 can be heavily doped relative to the substrate 110.

The OTP element 100 also includes a plurality of spacers 212, a passivation layer 234, and a plurality of conductive plugs 242 over the substrate 100. The spacers 212 are disposed on sidewalls of the second electrode 192, and the second impurity regions 220 is self-aligned to the spacers 212. The passivation layer 234 covers the second electrode 192, the second impurity regions 220 and the spacers 212; the conductive plugs 242 penetrate through the passivation layer 234 and contacting the second impurity regions 220.

The semiconductor device 10 further includes a plurality of metal lines 250 disposed on the passivation layer 234 and contacting the conductive plugs 242. Each of the metal lines 250 can be used as the first metal line ML1 in FIG. 3. As illustrated in FIG. 1, each of the metal lines 250 extends in the first direction X and serves to connect the OTP elements 100 arranged in a same row.

Figure 4:
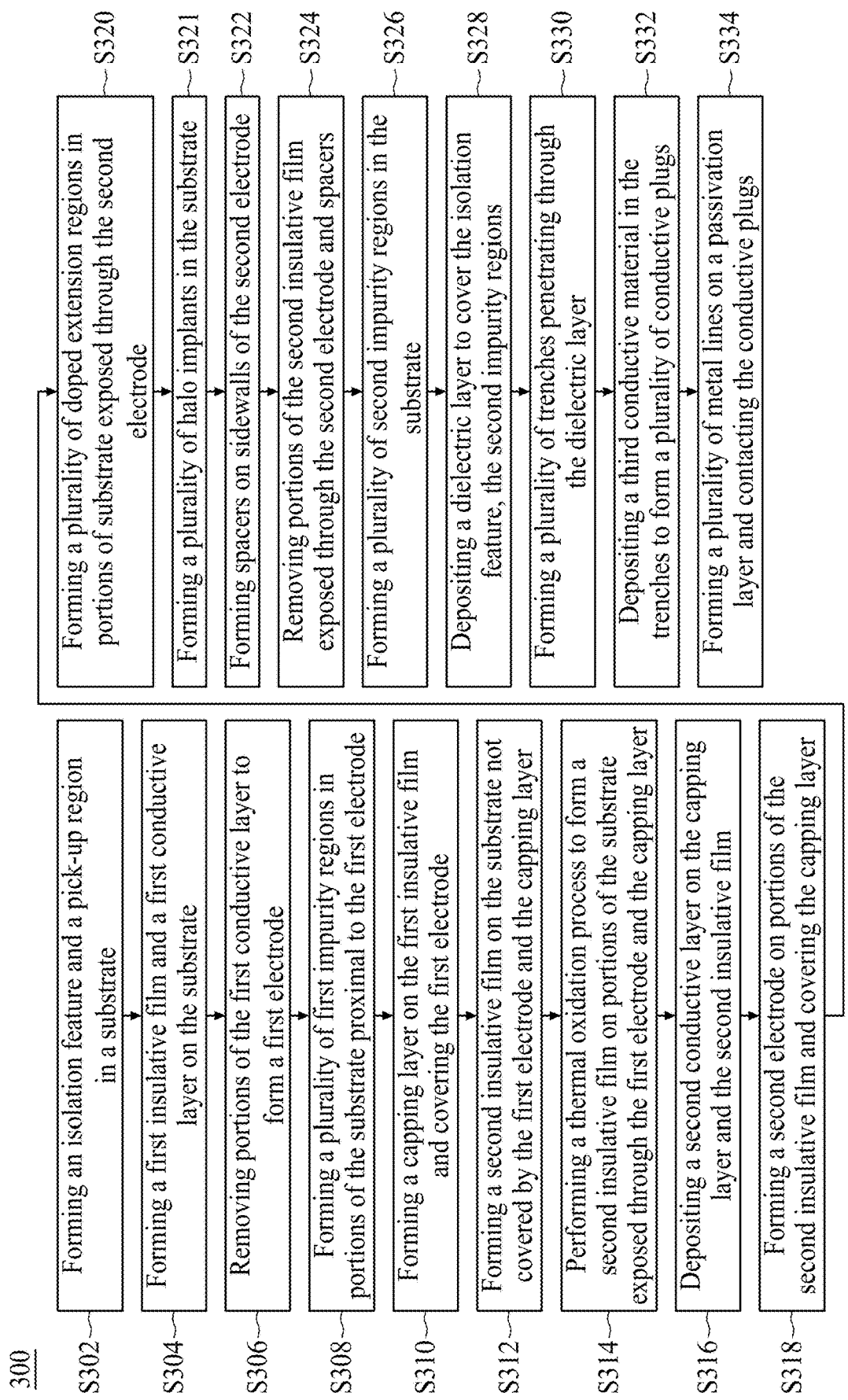
FIG. 4 is a flow diagram illustrating a method of fabricating a semiconductor device in accordance with some embodiments of the present disclosure.

FIG. 4 is a flow diagram illustrating a method 300 of fabricating a semiconductor device in accordance with some embodiments of the present disclosure, and FIGS. 5 to 23 illustrate intermediate stages in the formation of the semiconductor device in accordance with some embodiments of the present disclosure. The stages shown in FIGS. 5 to 23 are referred to in the flow diagram in FIG. 4. In the following discussion, the fabrication stages shown in FIGS. 5 to 23 are discussed in reference to the process steps shown in FIG. 4.

Figure 5:
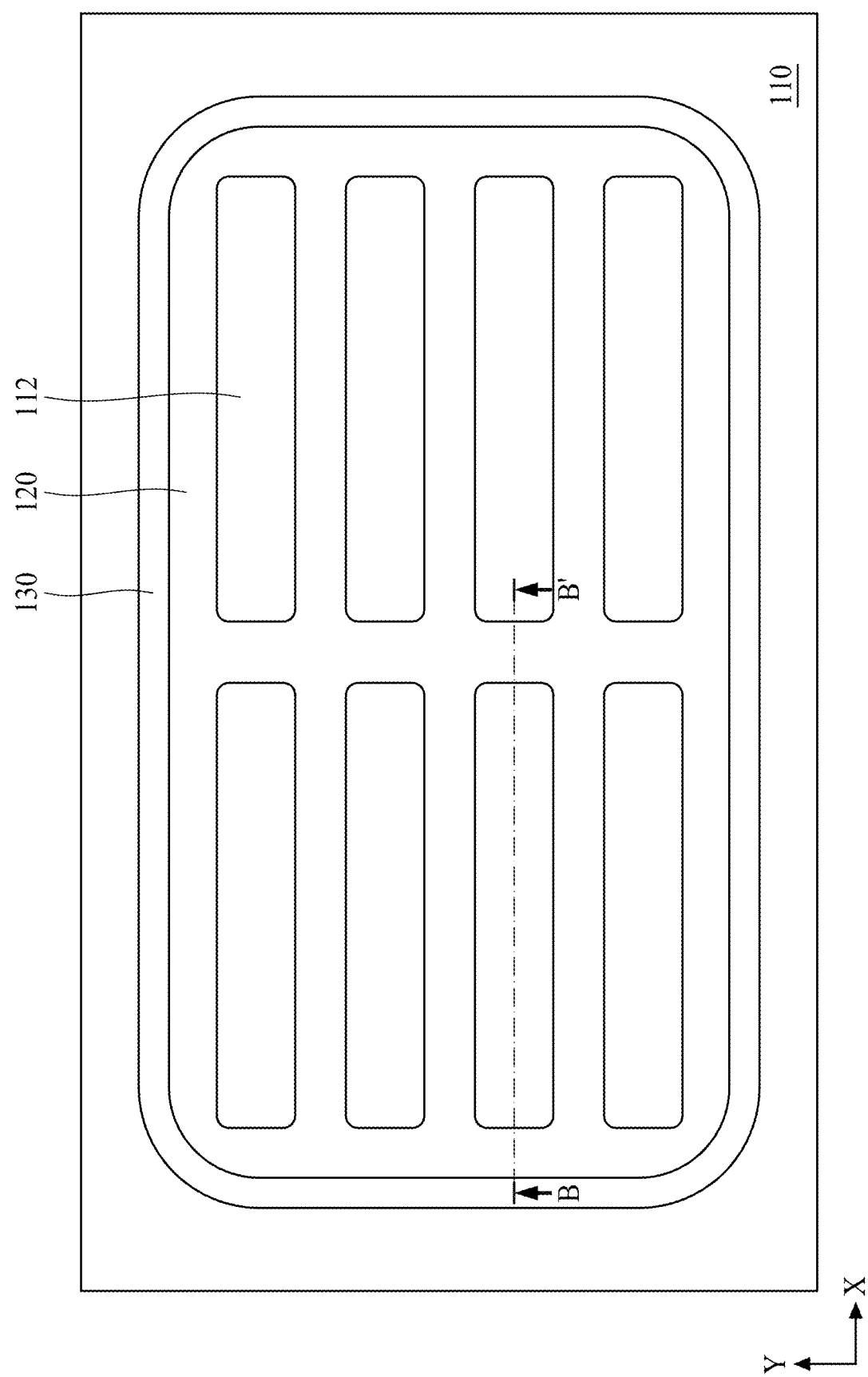
FIG. 5 is a plan view of an intermediate stage in the formation of a semiconductor device in accordance with some embodiments of the present disclosure.
Figure 6:
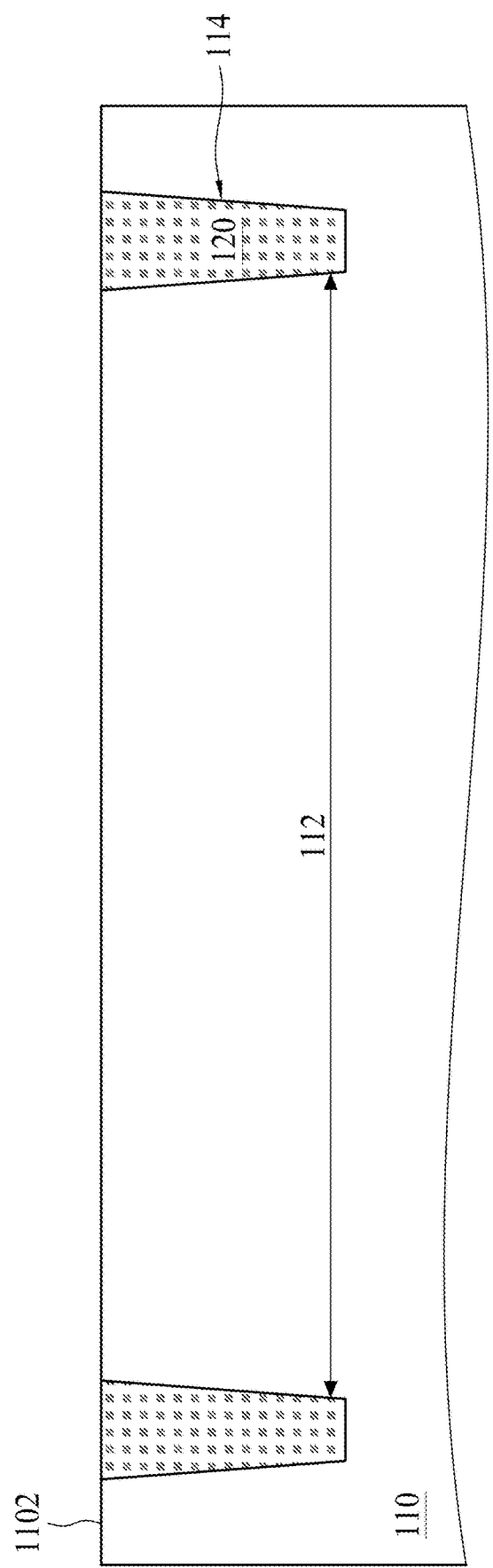
FIG. 6 is a cross-sectional view taken along a line B-B' in FIG.

The method 300 begins at step S302, in which an isolation feature 120 and a pick-up region 130 are formed in a substrate 110, as shown in FIGS. 5 and 6. The substrate 110 is a doped silicon-containing semiconductor substrate with a first conductivity type. For example, the substrate 110 is a p-type doped silicon substrate. The isolation feature 120 is formed in the substrate 110 to define a plurality of active regions 112 extending in a first direction X. The isolation feature 120 can be formed in the substrate 110 by photolithographic definition, anisotropically etching the substrate 110 to form one or more first trenches 114, depositing an isolation material in the first trenches 114, and removing excess isolation material, thereby exposing a surface 1102 of the substrate 110. The first trenches 114 are formed in the substrate 110 using a reaction ion etching (RIE) process, for example. The isolation material may comprise silicon oxide and is deposited in the first trenches 114 using, for example, a chemical vapor deposition (CVD) process, and the excess isolation material is removed from the substrate 110 using a planarization process, such as a chemical mechanic polishing (CMP) process.

The pick-up region 130, around the active regions 112 and the isolation feature 120, is formed by doping the substrate 100 with dopants of the first conductivity type. A concentration of the dopants of the first conductivity type is greater in the pick-up region 130 than in other portions of the substrate 100.

Figure 7:
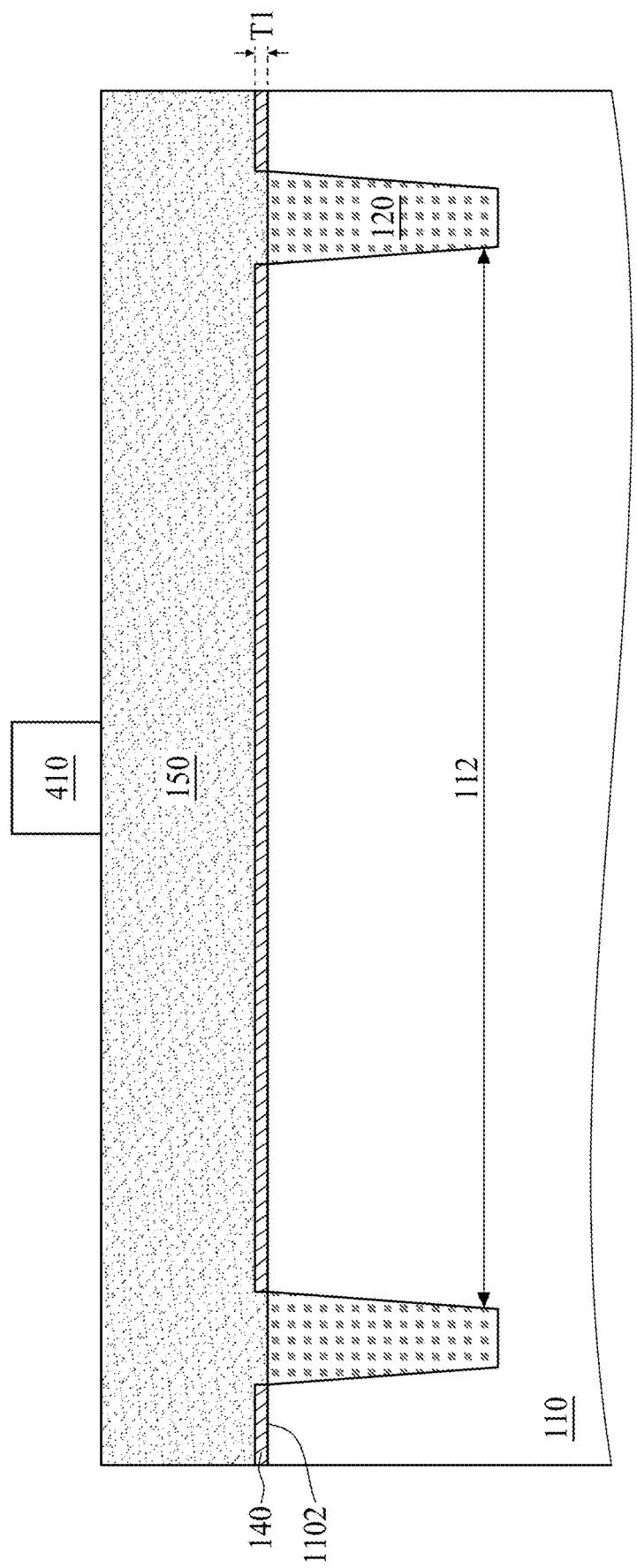
FIGS. 7 to 23 are cross-sectional views of intermediate stages in the formation of the semiconductor device in accordance with some embodiments of the present disclosure.

Referring to FIG. 7, a first insulative film 140 and a first conductive layer 150 are successively formed on the substrate 110 according to step S304 in FIG. 4. The first insulative film 140 is silicon dioxide, which is thermally grown on the substrate 110. In other words, the first insulative film 140 is formed using a thermal oxidation process to consume silicon material of the substrate 110. It should be noted that the silicon dioxide film does not grow on the isolation feature 120, and only grows on the exposed surface 1102 of the substrate 110. The first insulative film 140 can have a first thickness T1. The first conductive layer 150, including polysilicon, is deposited on the isolation feature 120 and the first insulative film 140 by a deposition process such as a low-pressure CVD process.

After the deposition of the first conductive layer 150, a first pattern mask 410 is provided on the first conductive layer 150. The first pattern mask 410 can include photosensitive material. In some embodiments, the photosensitive material is applied to fully cover the first conductive layer 150 by a spin-coating process and then dried using a soft-baking process, and the first pattern mask 410 is formed by performing at least one exposure process and at least one develop process on the photosensitive material.

Figure 8:
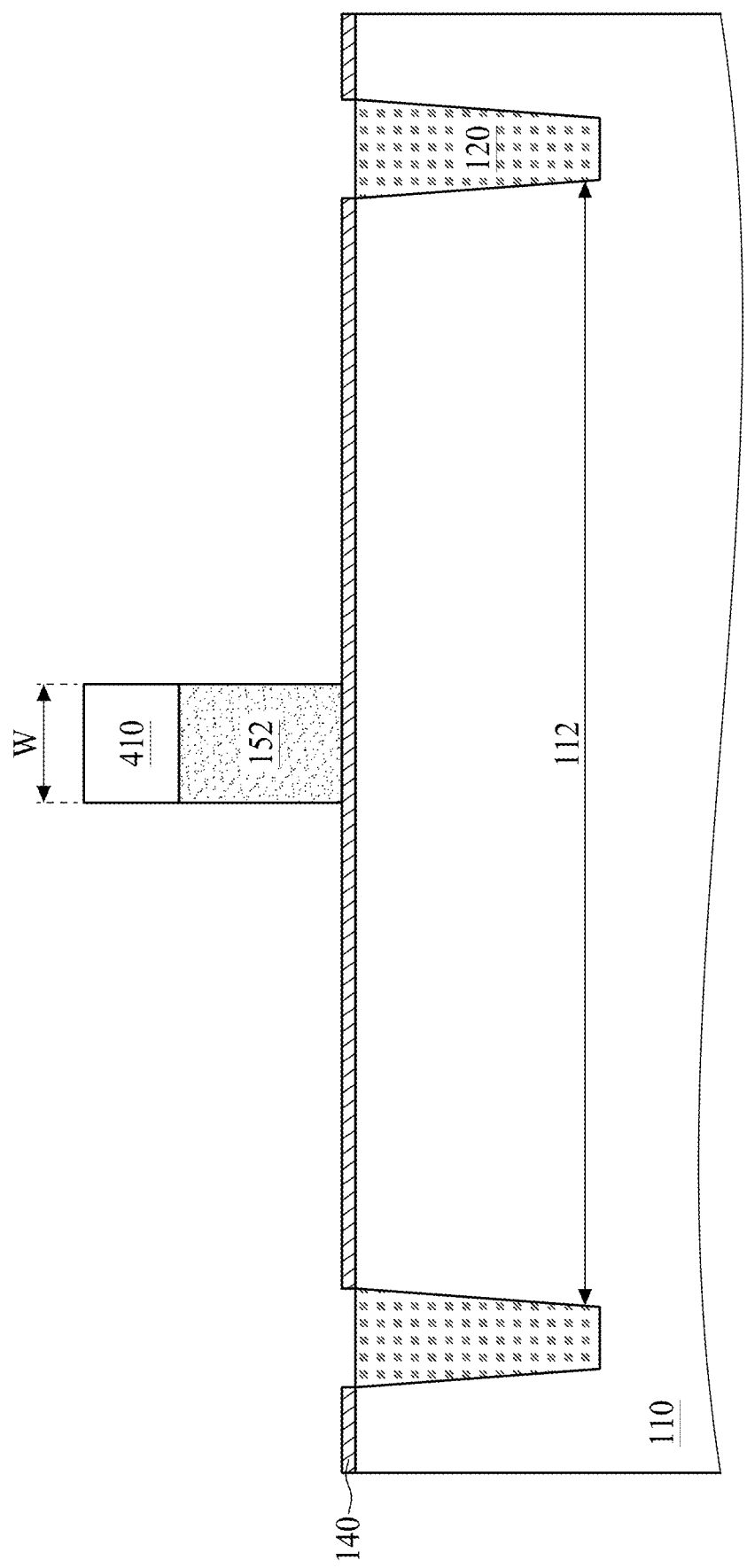

Next, the method 300 proceeds to step S306, in which an etching process is performed to remove portions of the first conductive layer 150 exposed through the first pattern mask 410 and thus form a first electrode 152, as shown in FIG. 8. The first conductive layer 150 is anisotropic etched, such as by an RIE etching process, to expose portions of the substrate 110 and the isolation feature 120 not covered by the first pattern mask 410. Since the anisotropic etching process etches in the vertical direction only, the first electrode 152 has a same width as the first pattern mask 410. In some embodiments, the first electrode 152 can have a width W in a range of about 30 to 100 nm. After the first electrode 152 is created, the first pattern mask 410 is removed using an ashing process or a wet strip process, for example, wherein the wet strip process may chemically alter the first pattern mask 410 so that it no longer adheres to the first electrode 152.

Figure 9:
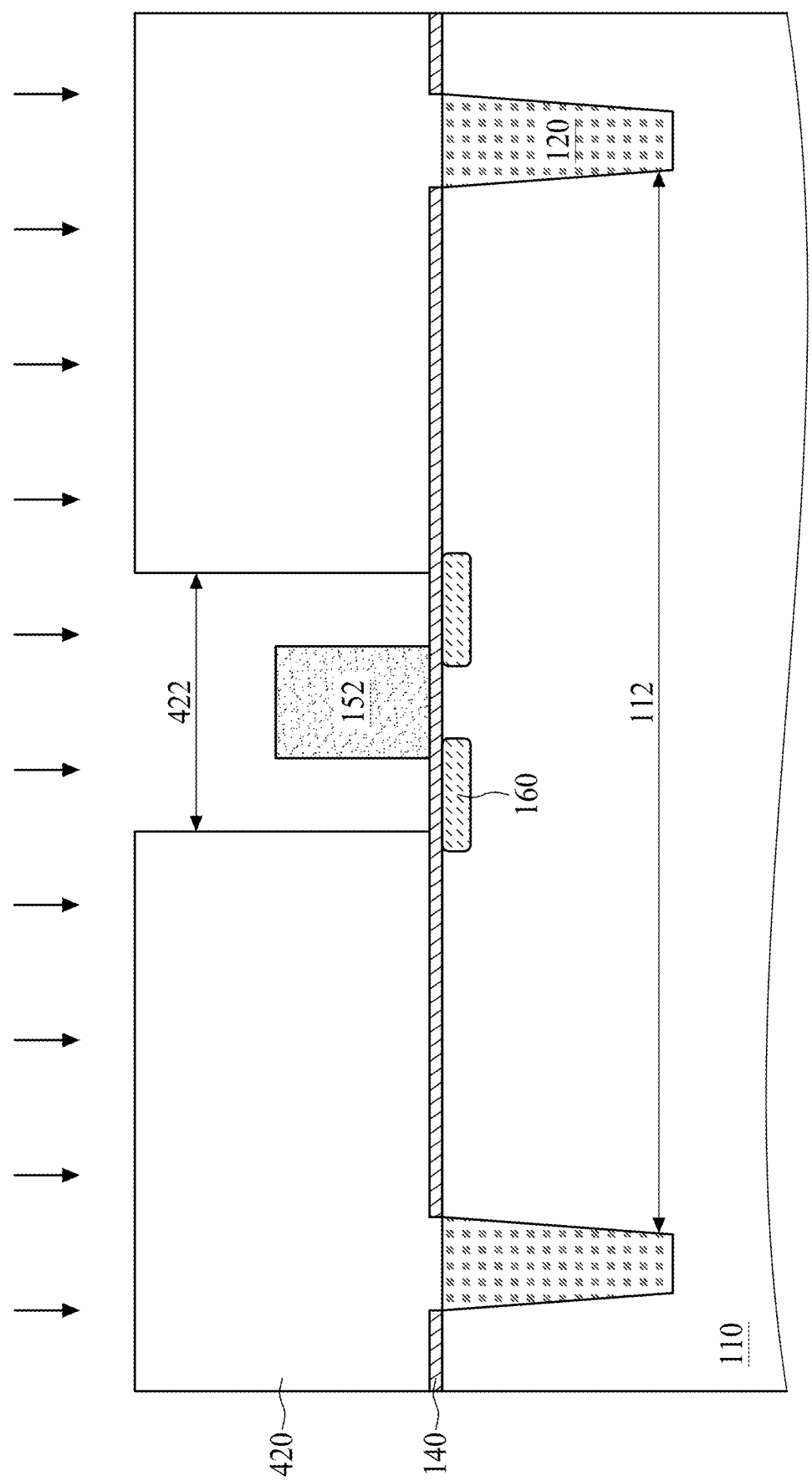

Referring to FIG. 9, a second pattern mask 420, including an opening 422, is provided on the isolation feature 120 and the first insulative film 140. The second pattern mask 420 includes the opening 422 to expose the first electrode 152 and portions of the first insulative film 140 proximal to the first electrode 152. The second pattern mask 420 is formed by steps including (1) conformally coating a photosensitive material on the first insulative film 140 and the first electrode 152, (2) exposing portions of the photosensitive material to radiation (not shown), (3) performing a post-exposure baking process, and (4) developing the photosensitive material, thereby forming the opening 422 to expose the first electrode 152 and portions of the first insulative film 140 proximal to the first electrode 152.

Next, the method 300 proceeds to step S308, in which a first implantation process is performed to form a plurality of first impurity regions 160 in the substrate 110. The first impurity regions 160 are formed by implanting dopants having a second conductivity type (i.e., n-type) in regions of substrate 110 that are exposed by the first electrode 152 and the second pattern mask 420. Optionally, an activation anneal of the n-type impurities is carried out, wherein the n-type impurities are laterally diffused to regions of the substrate 110 beneath the first electrode 152 by heat treatment. The first impurity regions 160 contact the first insulative film 140 at a first depth D1 (shown in FIG. 2). After the first impurity regions 160 are formed, the second pattern mask 420 is removed using an ashing process or a wet strip process, for example.

Figure 10:
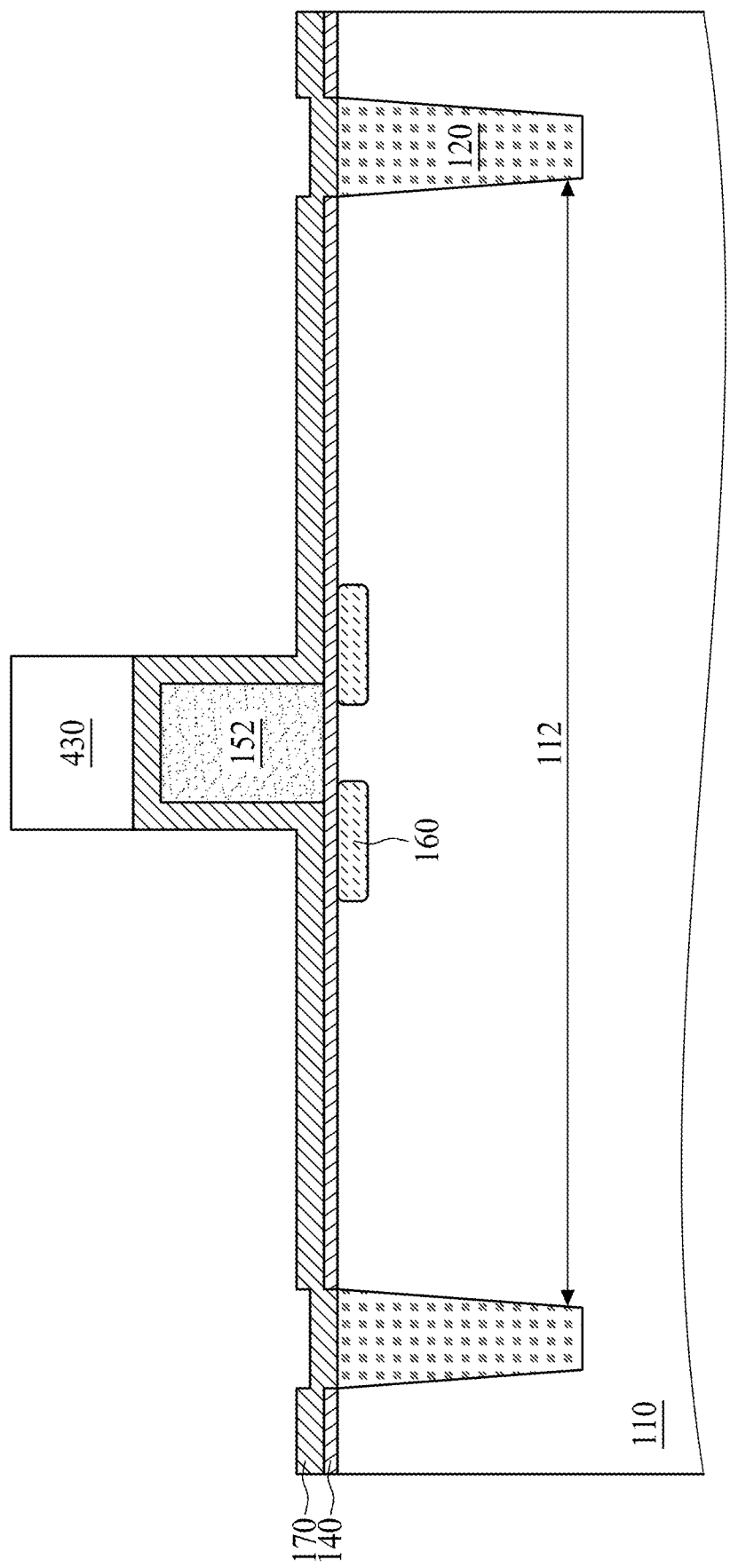

Referring to FIG. 10, a first dielectric layer 170 is deposited on the isolation feature 120, the first insulative layer 140 and the first electrode 152. The first dielectric layer 170 may include silicon dioxide, for example. The first dielectric layer 170 can be formed using a CVD process or an atomic layer deposition (ALD) process. Next, a blanket layer of photosensitive material is formed on the first dielectric layer 170. The blanket layer of the photosensitive material is then patterned to provide a third pattern mask 430 utilizing a lithographic process that may include exposing the photosensitive material to a pattern of radiation and developing the exposed photosensitive material utilizing a developer. The third pattern mask 430 is disposed on a portion of the first dielectric layer 170 attached to the first electrode 152.

Figure 11:
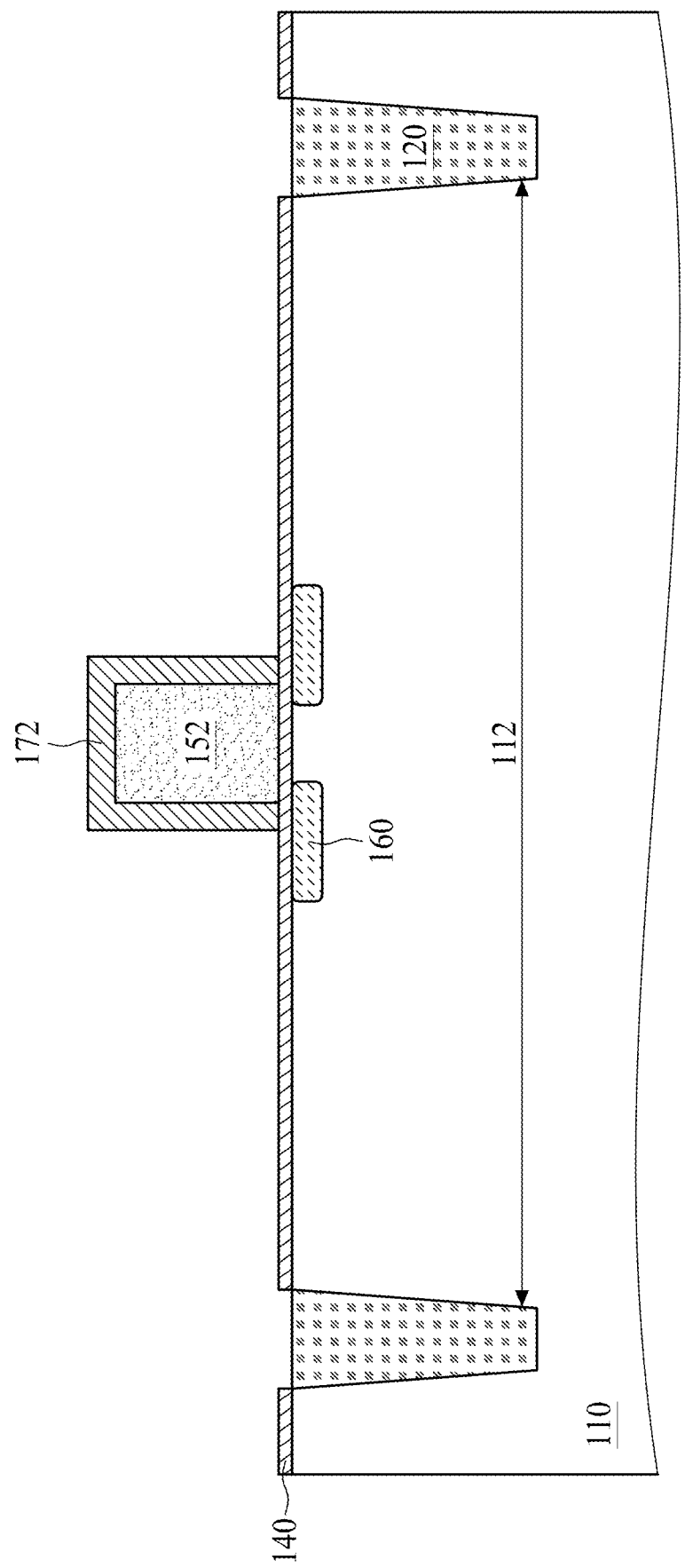

Following the formation of the third pattern mask 430, an etching process is conducted to remove portions of the first dielectric layer 170 exposed through the third pattern mask 430, as shown in FIG. 11. Accordingly, a capping layer 172 disposed on the first insulative film 140 and covering the first electrode 152 is formed according to step S310 in FIG. 4. The etching process may be an anisotropic process, such as an RIE etching process. After the capping layer 172 is formed, the third pattern mask 430 is removed using a suitable process.

Figure 12:
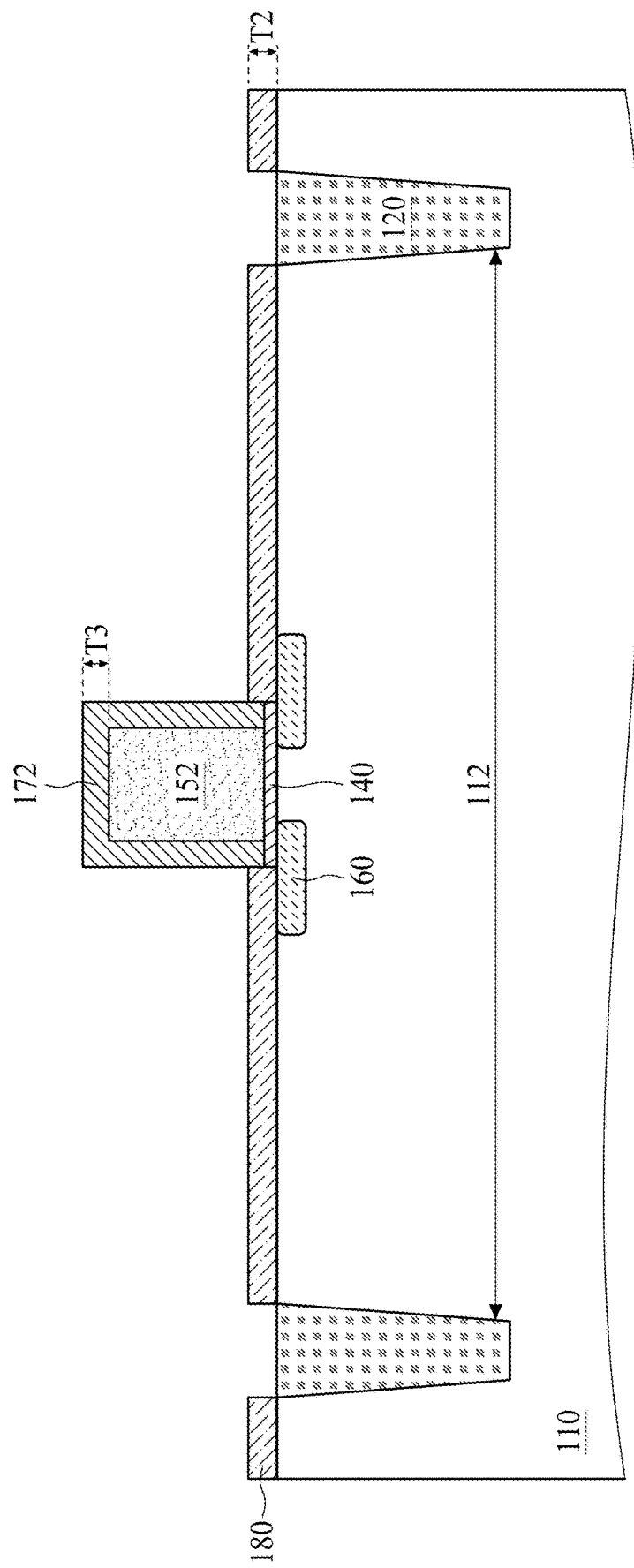

Referring to FIG. 12, a thermal oxidation process is performed to form a second insulative film 180 on portions of the substrate 110 exposed through the first electrode 152 and the capping layer 172 according to step S314. More particular, during the thermal oxidation process, portions of the first insulative film 140 exposed through the first electrode 152 and the capping layer 172 become thicker than a portion of the first insulative film 140 covered by the first electrode 152 and the capping layer 172. That is, the second insulative film 180 has a second thickness T2 greater than the first thickness T1 of the first insulative film 140 (shown in FIG. 7). The second insulative film 180, including silicon dioxide, may be formed using a temperature greater than that used to form the first insulative film 140. The capping layer 172 can have a third thickness T3 less than the width W (shown in FIG. 8) of the first electrode 152. In some embodiments, the third thickness T3 is in a range of 2 to 3 nm.

Figure 13:
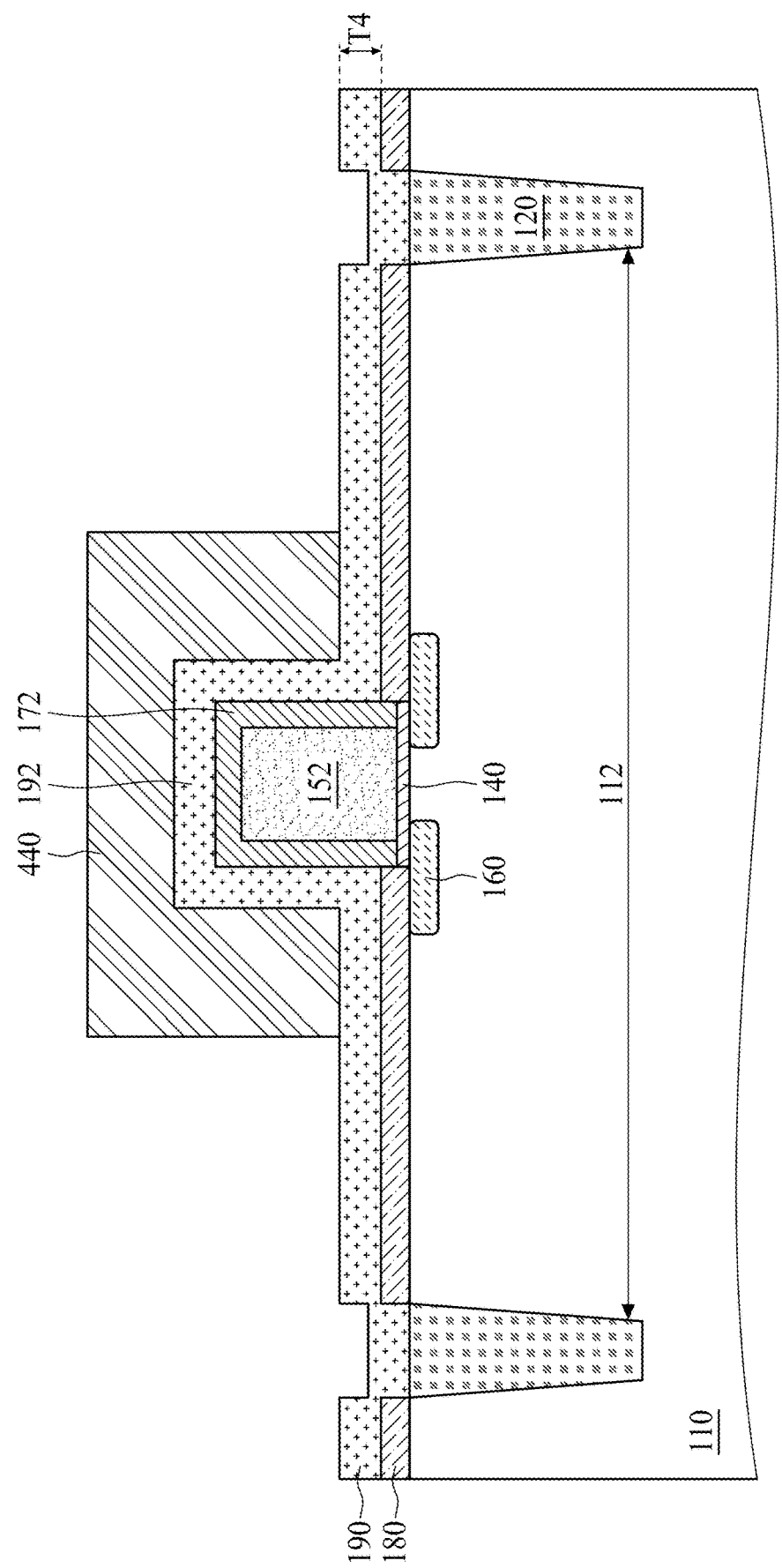

Referring to FIG. 13, a second conductive layer 190 is deposited on the isolation feature 120, the capping layer 172 and the second insulative film 180 according to step S316 in FIG. 4. The second conductive layer 190, having a substantially uniform thickness, has a topology following the topology of the exposed portions of the isolation feature 120, the capping layer 172 and the second insulative film 180. In some embodiments, the second conductive layer 190 has a fourth thickness T4. The first conductive layer 150 and the second conductive layer 190 may include a same material. For example, the second conductive layer 190 includes polysilicon and may be formed using a low-pressure CVD process.

Subsequently, a fourth pattern mask 440 including photosensitive material is applied on a portion of the second conductive layer 190 over the capping layer 172. The fourth pattern mask 440 is provided to define a channel region of the semiconductor device 10.

Figure 14:
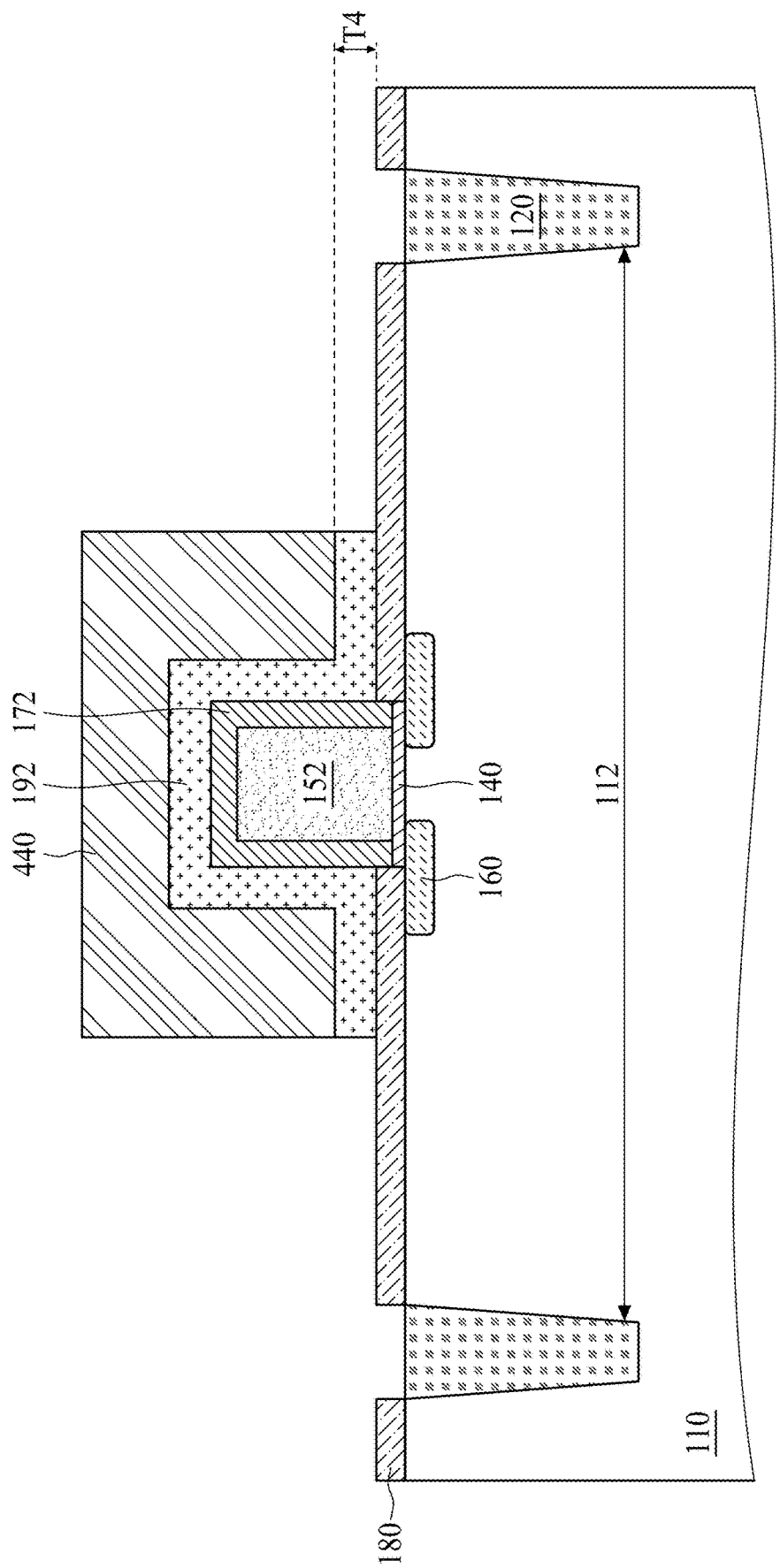

Referring to FIG. 14, portions of the second conductive layer 190 exposed through the fourth pattern mask 440 are removed to form a second electrode 192 according to step S318 in FIG. 4. In some embodiments, an anisotropic etching process such as an RIE process is performed by using the fourth pattern mask 440 to form the second electrode 192. The second electrode 192 may have the fourth thickness T4 less than the width W of the first electrode 152 (shown in FIG. 8). In some embodiments, the width W is about 2 to 3 times the fourth thickness T4. After the second electrode 192 is formed, the fourth pattern mask 440 is removed using, for example, an ashing process or a wet strip process.

Figure 15:
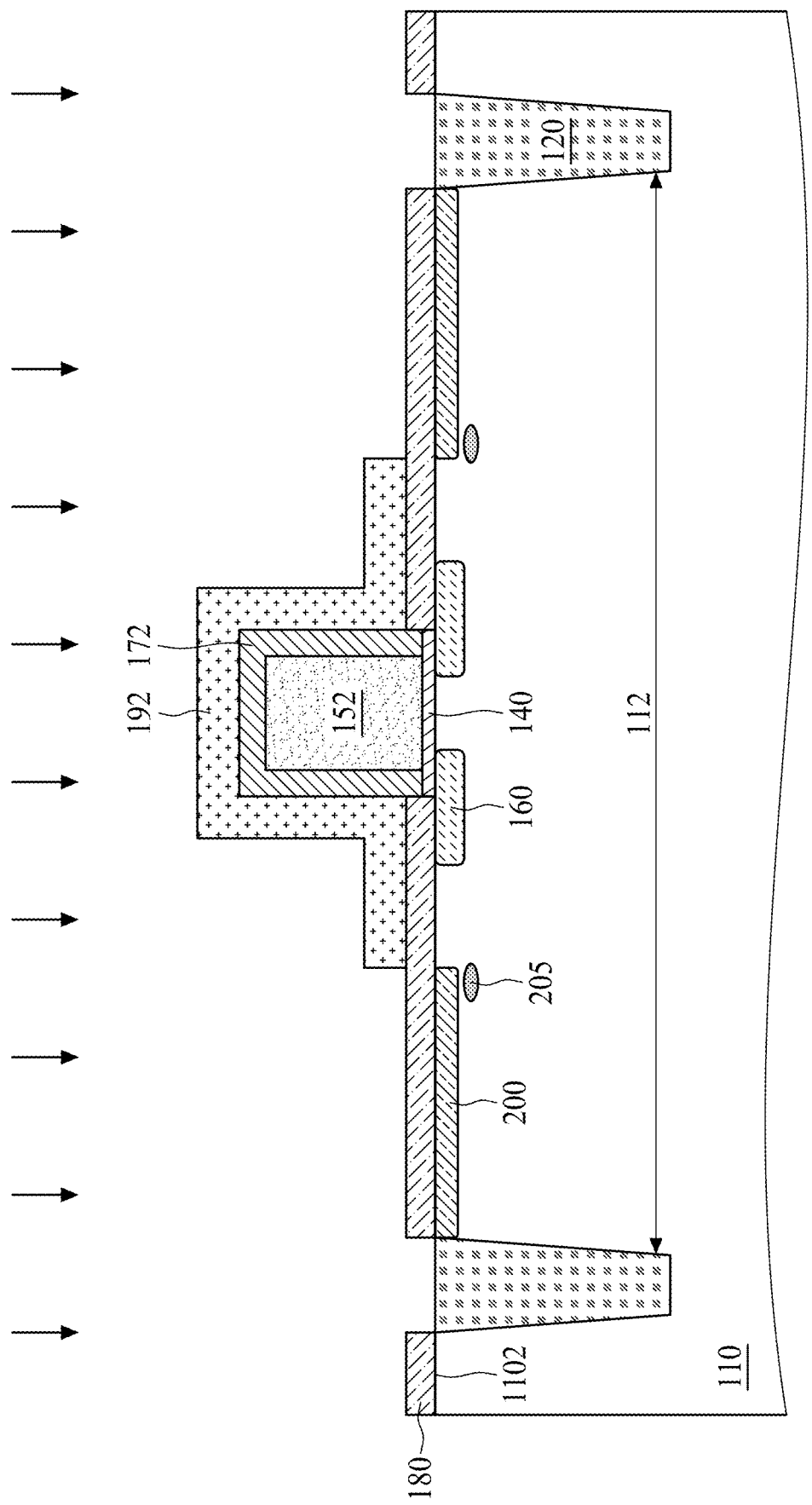

Referring to FIG. 15, doped extension regions 200 are formed by implanting dopants of the second conductivity type in portions of the substrate 100 using the second electrode 192 as a mask according to step S320 in FIG. 4. In other words, the doped extension regions 200 are self-aligned to the second electrode 192 and in contact with the second insulative film 180. Dopant for the formation of the doped extension regions 200 are implanted perpendicular to the surface 1102 of the substrate 110.

Subsequently, a plurality of halo implants 205 are formed in the substrate 110 according to step S321 in FIG. 4. The halo implants 205 can be buried regions so that they are not in contact with the second insulative film 180. Dopants of the first conductivity type are implanted at an angle so that the dopants can be implanted underneath the LDD regions 200. The angle of implantation is substantially less then ninety degrees relative the surface 1102 of the substrate 110. However, the dopant for the formation of the halo implants 205 may be implanted perpendicular to the surface 1102 of the substrate 110.

Figure 16:
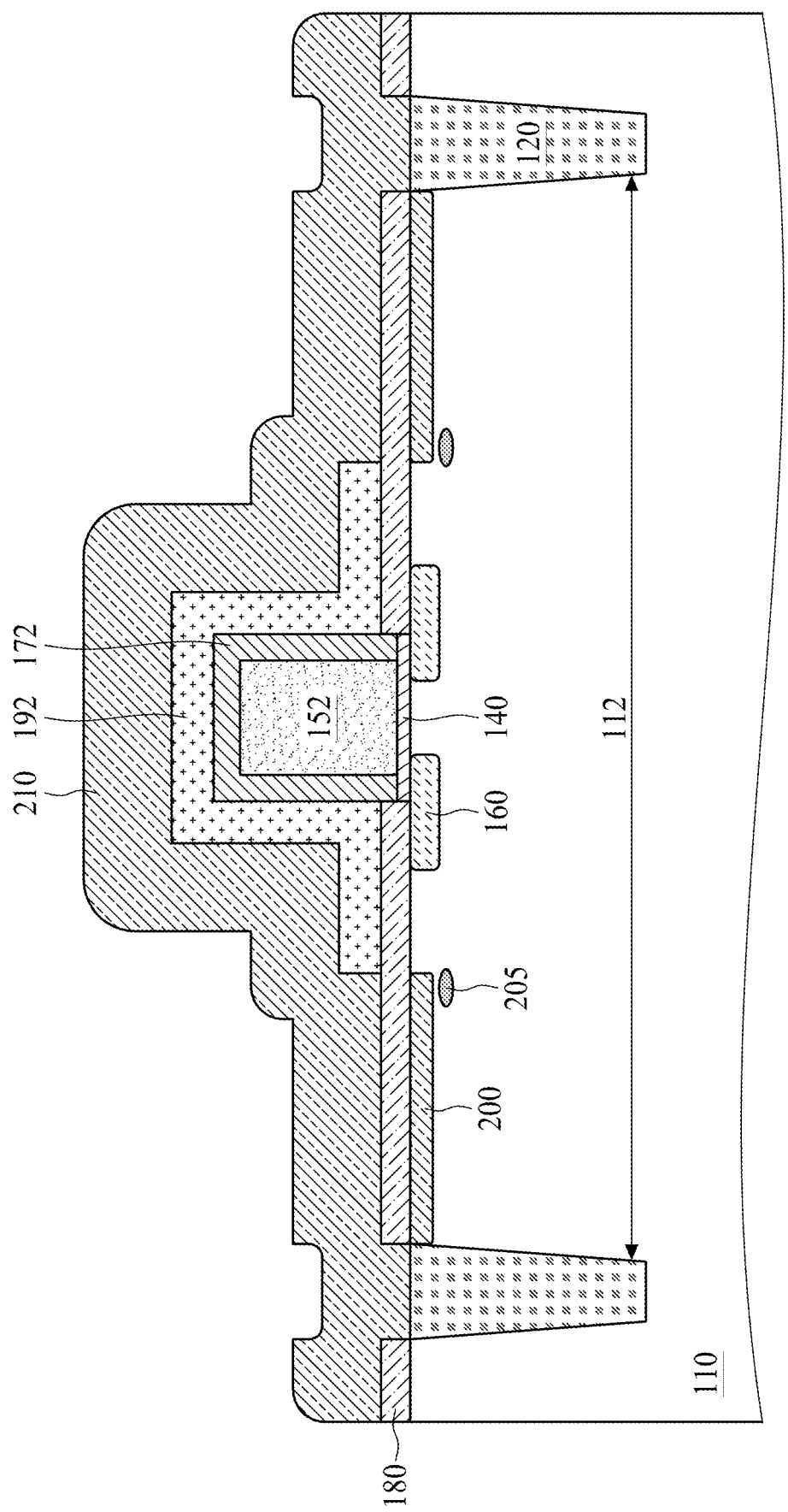

Referring to FIG. 16, a spacer layer 210 is deposited on the isolation structures 120, the second insulative film 170 and the second electrode 182. The spacer layer 210 may include oxide, nitride, oxynitride or high-k material and can be deposited by a plasma enhanced CVD process. In some embodiments, the spacer layer 120 includes silicon dioxide.

Figure 17:
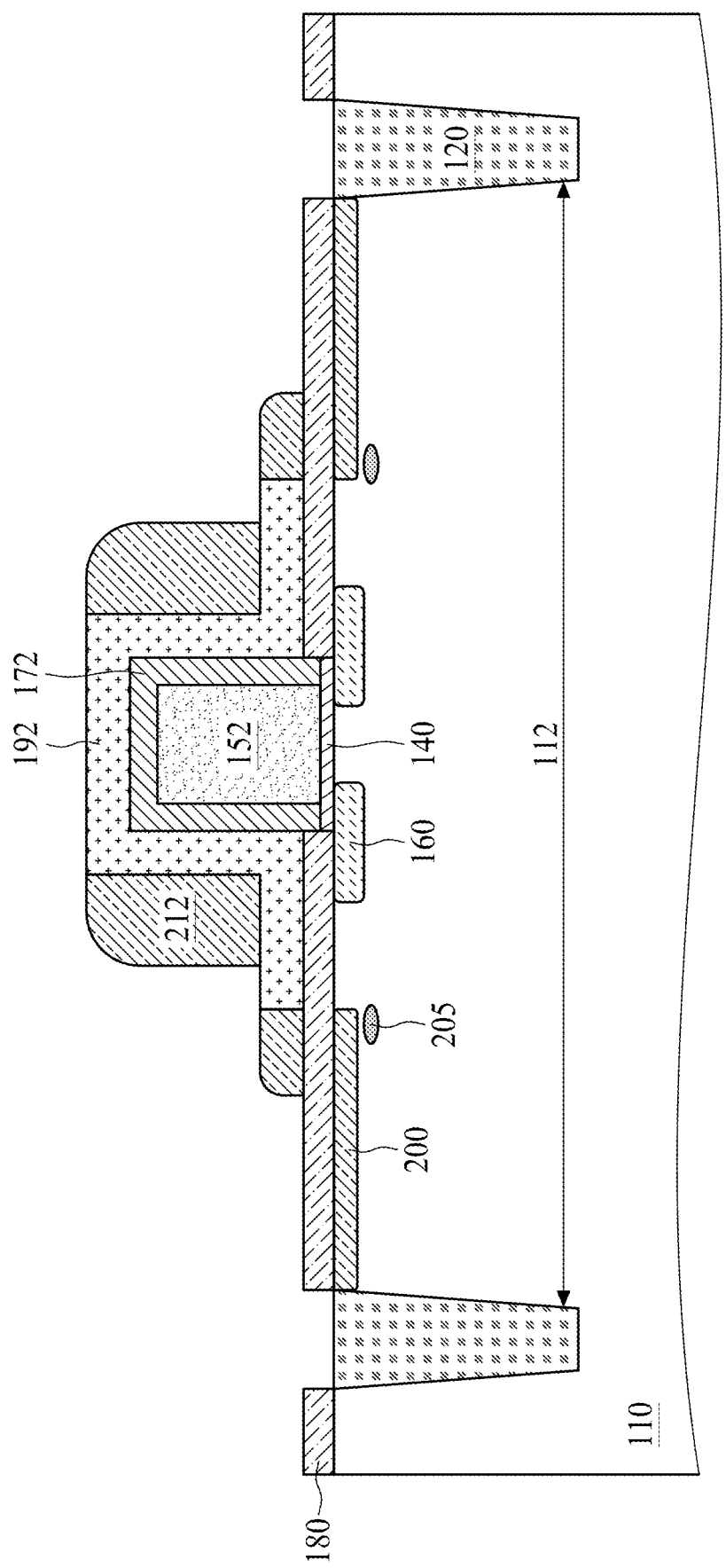

Referring to FIG. 17, an anisotropic etching process is performed to remove horizontal portions of the spacer layer 210 according to step S322 in FIG. 4. Consequently, spacers 212 are formed on sidewalls of the second electrode 192.

Figure 18:
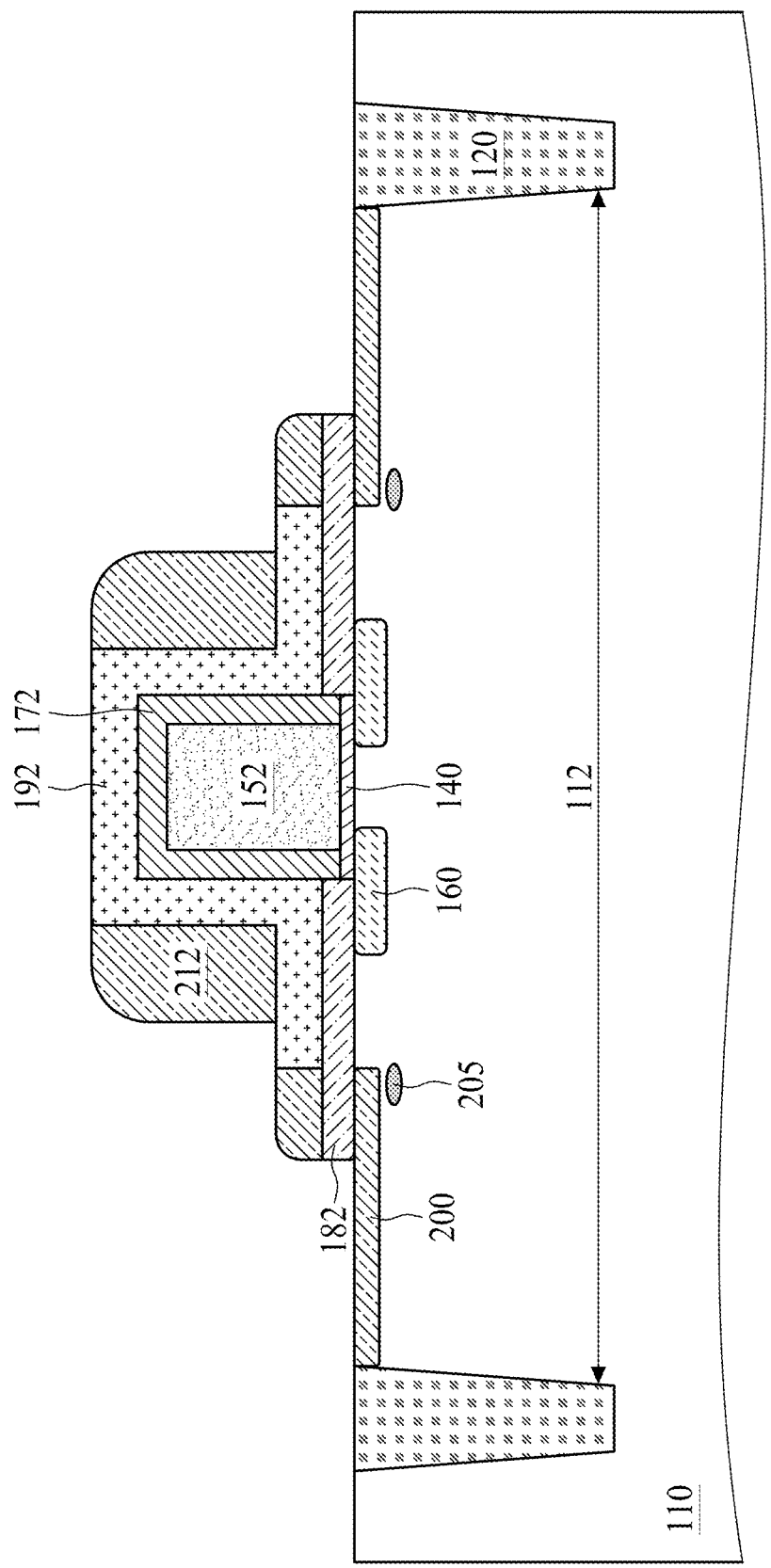

Referring to FIG. 18, portions of the second insulative film 180 not covered by the spacers 212 are removed from the substrate using an etching process according to step S324 in FIG. 4. Accordingly, portions of the doped extension regions 200 are exposed.

Figure 19:
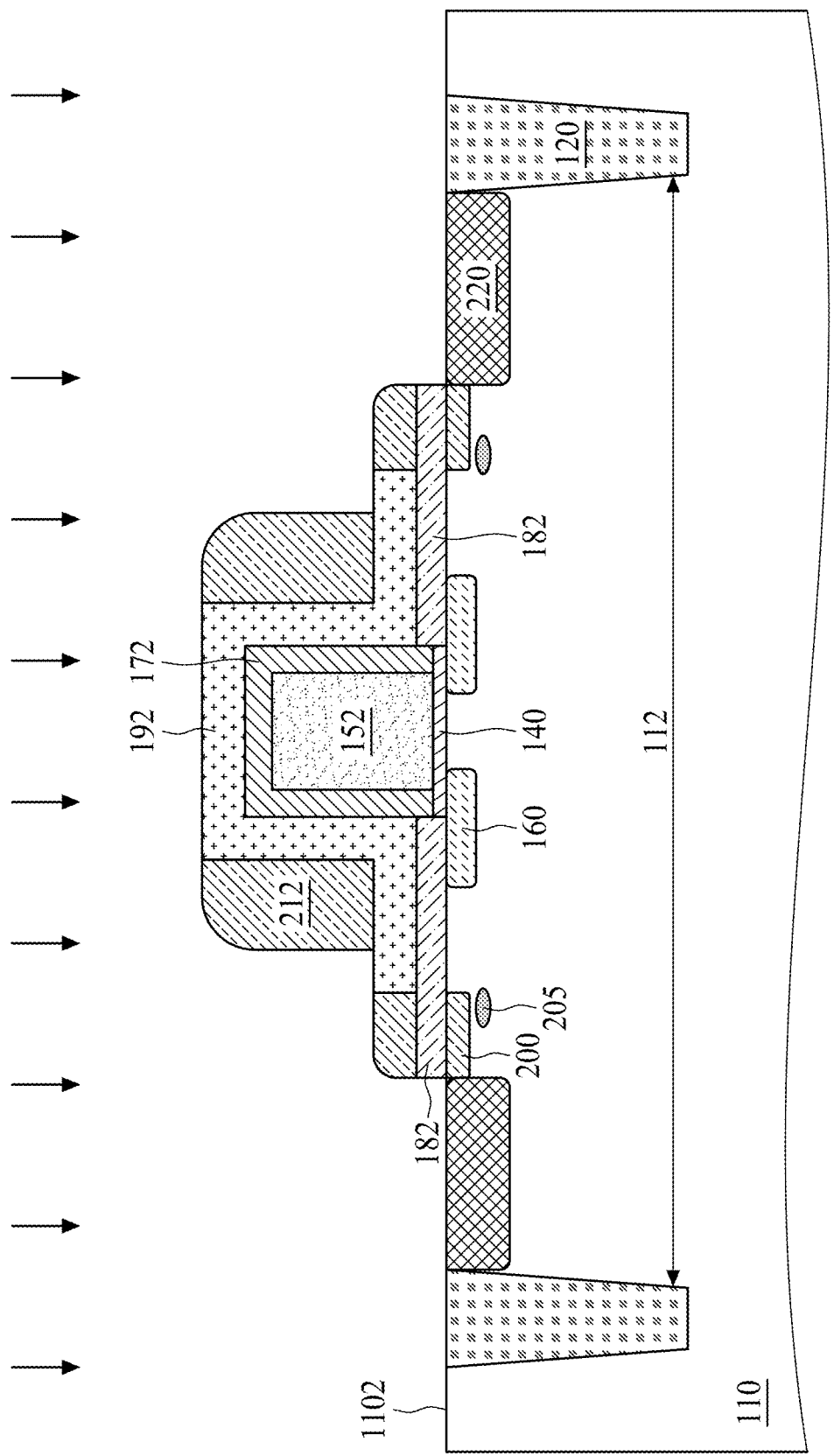

Referring to FIG. 19, a plurality of second impurity regions 220 are formed in the substrate 110 according to step S326 in FIG. 4. An implantation process is performed to form the second impurity regions 220 using the spacers 212 as a mask. The implantation includes implanting dopants having the second conductivity type into portions of the substrate exposed by the second electrode 192 and the spacers 212. In some embodiments, dopant for the formation of the second impurity regions 220 are implanted perpendicular to the surface 1102 of the substrate 110.

Figure 20:
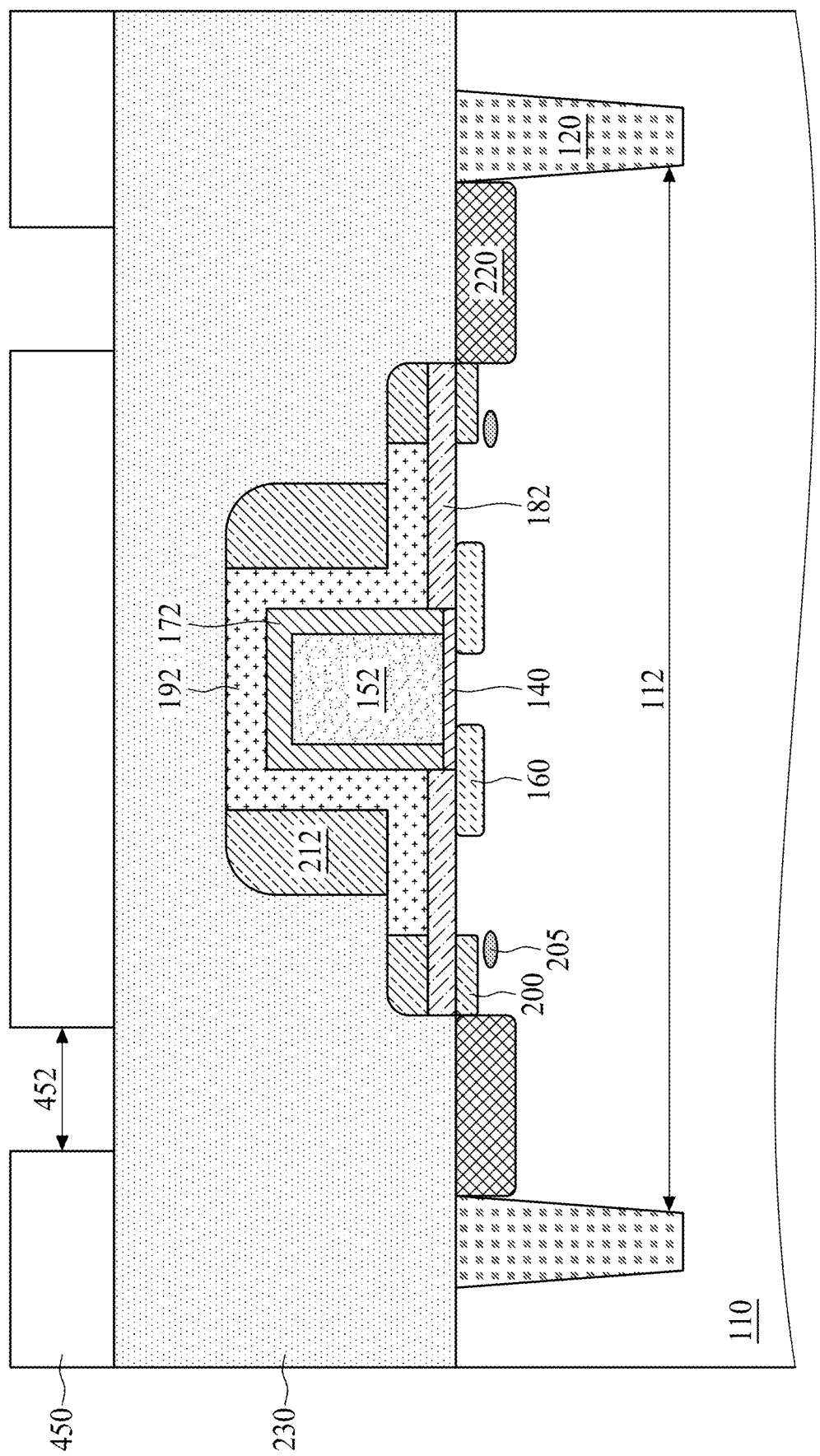

Referring to FIG. 20, a second dielectric layer 230 is deposited to cover the isolation feature 120, the second electrode 182 and the second impurity regions 220 according to step S328 in FIG. 4. After the deposition, the second dielectric layer 230 may be planarized, using, for example, a CMP process, to yield an acceptably flat topology.

Subsequently, a fifth pattern mask 450 is formed on the second dielectric layer 230. The fifth pattern mask 450, including photosensitive material, is formed by steps including (1) conformally coating a photosensitive material on the second dielectric layer 230, (2) exposing portions of the photosensitive material to radiation (not shown), (3) performing a post-exposure baking process, and (4) developing the photosensitive material, thereby forming openings 452 over the second impurity regions 220.

Figure 21:
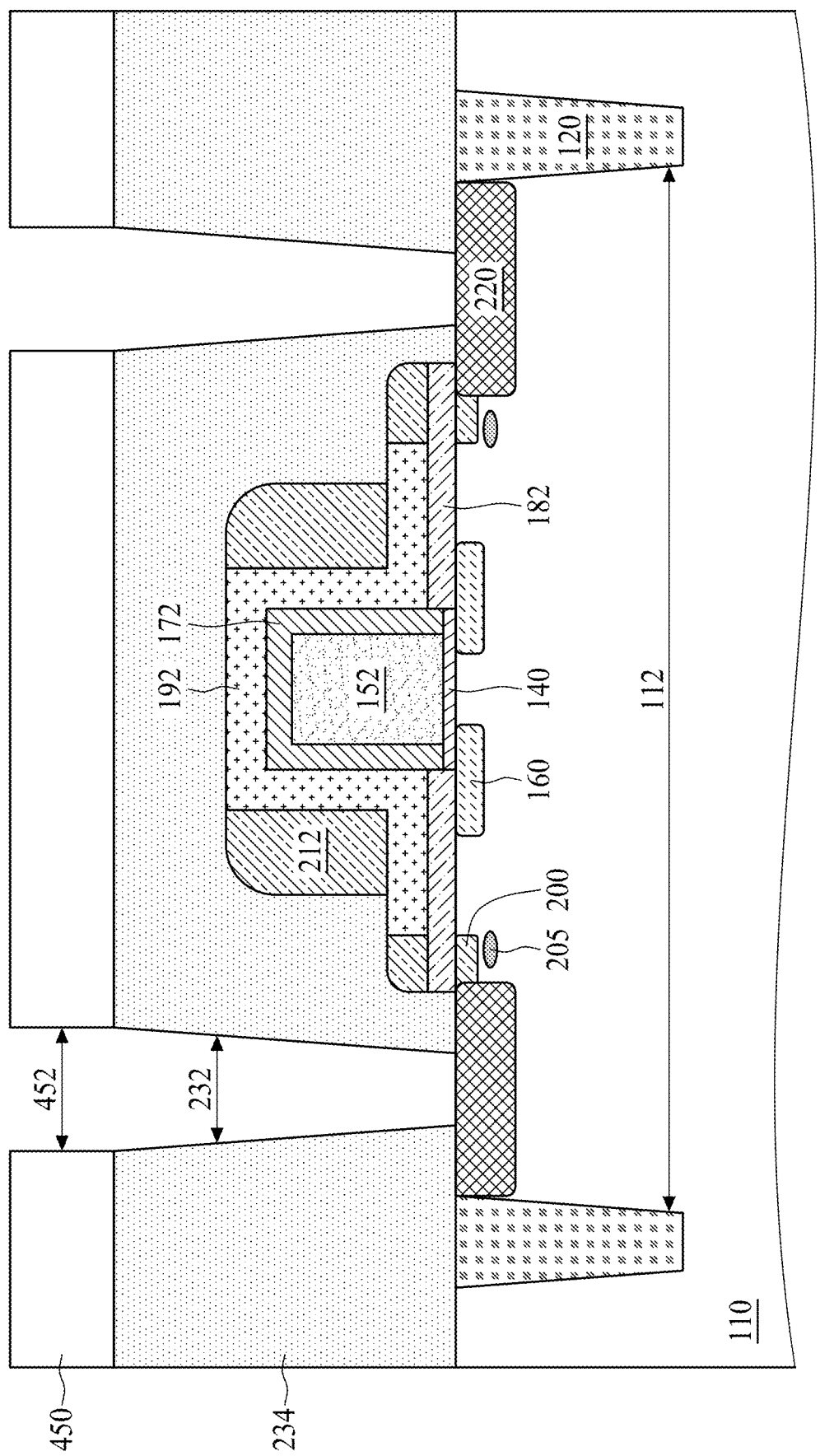
Figure 22:
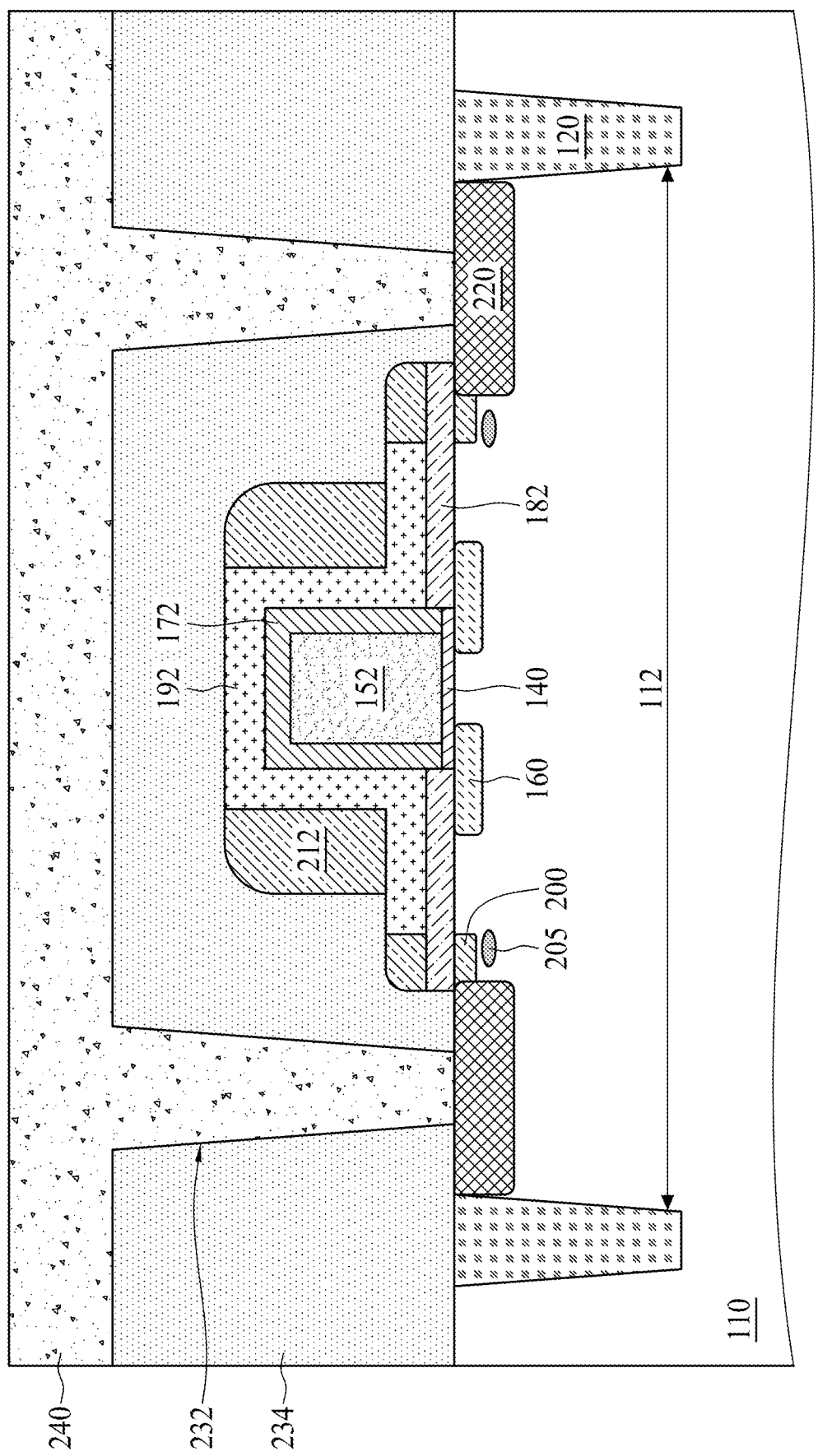

Referring to FIG. 21, a plurality of second trenches 232 are formed in the second dielectric layer 230 to expose portions of second impurity regions 220 according to step S330 in FIG. 4. The portion of the second dielectric layer 230 is removed using a dry etching process, an anisotropic wet etching process, or any other suitable anisotropic process, so that the width of the openings 452 is substantially maintained in the second trenches 232. The second trenches 232 are formed using an etching process, for example, to form a passivation layer 234. The fifth feature pattern 452 is then removed using, for example, an ashing process or a wet strip process.

Next, a third conductive material 240 is deposited in the second trenches 232 according to step S332 in FIG. 4. The third conductive material 240 is uniformly deposited on the second impurity regions 220 and the passivation layer 234 until the second trenches 232 are entirely filled. The third conductive material 240 may be, for example, doped polysilicon. The third conductive material 240 is deposited using a plating process or a CVD process.

Figure 23:
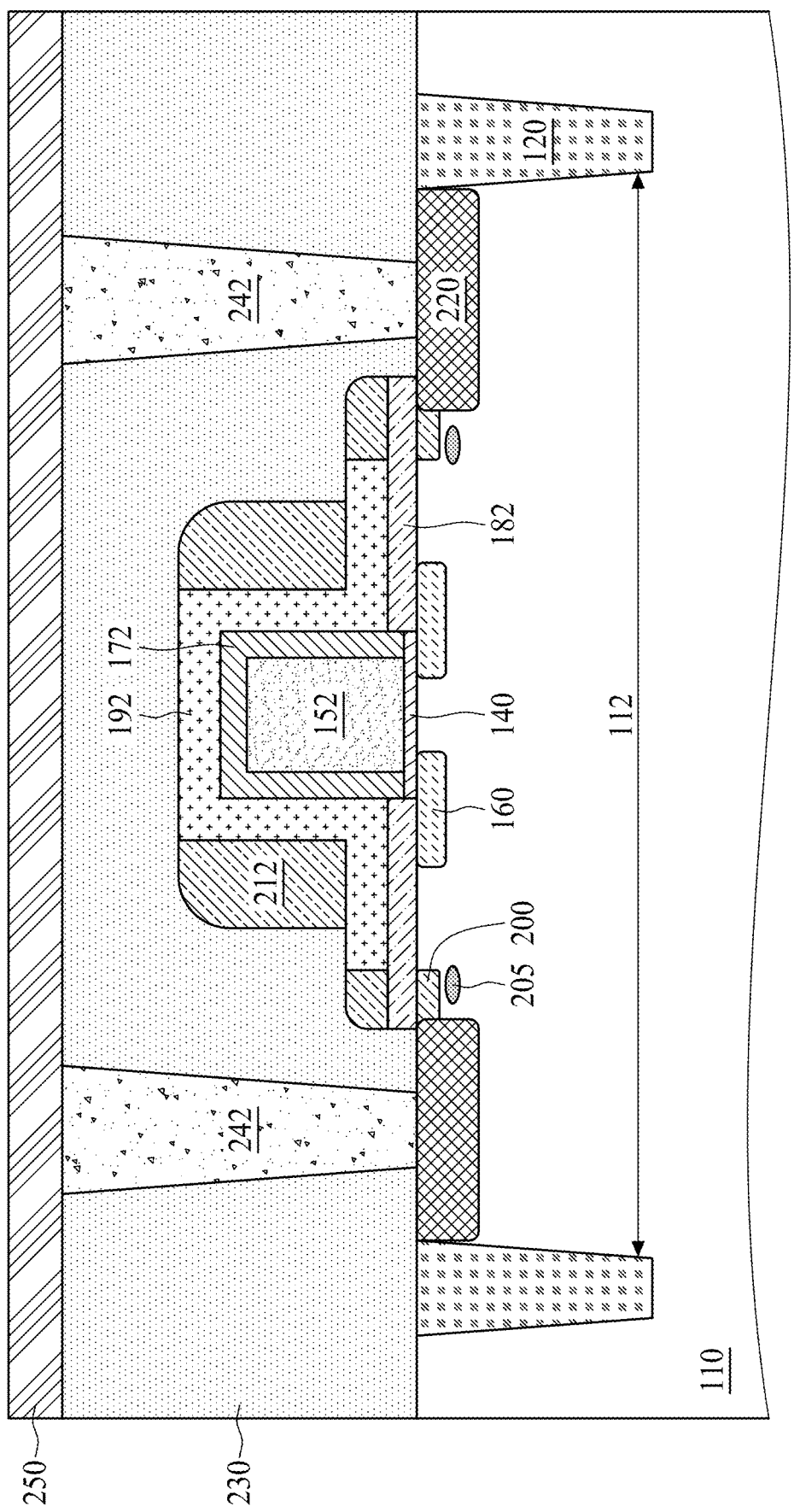

Next, a planarizing process is performed to remove the third conductive material 240 above the trenches 212. Consequently, a plurality of conductive plugs 222, as shown in FIG. 23, are formed. After the removal of the superfluous third conductive material 240, the passivation layer 234 is exposed.

Next, a plurality of metal lines 250 are formed on the passivation layer 234 and contact the conductive plugs 222 according to step S334 in FIG. 4. Therefore, the semiconductor device 10 is completely formed. The metal lines 250 may be formed by depositing a fourth conductive material to bury the passivation layer 234 and the conductive plugs 222 and patterning the fourth conductive material with a target pattern, using, for example, an anisotropic etching process.

One aspect of the present disclosure provides a semiconductor device. The semiconductor device comprises a substrate, a first insulative film, a second insulative film, a first electrode, a second electrode, a capping layer, a plurality of first impurity regions, and a plurality of second impurity regions. The first insulative film is disposed on the substrate. The second insulative film at least partially surrounds the first insulative film. The first electrode is disposed on the first insulative film, and the capping layer is disposed over the first insulative film and covers the first electrode. The second electrode covers the capping layer and is disposed over the second insulative film. The plurality of first impurity regions are disposed in the substrate and under the first insulative film and the second insulative film, wherein each of the first impurity regions extends under and across the second electrode and the first electrode. The plurality of second impurity regions are disposed in the substrate and exposed through the second insulative film and the second electrode.

One aspect of the present disclosure provides a method of manufacturing a semiconductor device. The method includes steps of forming a first insulative film on a substrate; forming a first electrode on the first insulative film; implanting dopants in the substrate to form a plurality of first impurity regions on either side of the first electrode; depositing a capping layer to cover the first electrode; forming a second insulative film on portions of the substrate exposed through the first electrode and the capping layer; forming a second electrode disposed over the capping layer and portions of the second insulative film; removing portions of the second insulative film on either side of the second electrode; and implanting dopants in portions of the substrate exposed by the second insulative film to form a plurality of second impurity regions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
a substrate;
a first insulative film disposed on the substrate;
a second insulative film at least partially surrounding the first insulative film;
a first electrode disposed on the first insulative film;
a capping layer disposed over the first insulative film and covering the first electrode;
a second electrode disposed over the second insulative film and covering the capping layer;
a plurality of first impurity regions disposed in the substrate and under the first insulative film and the second insulative film, wherein each of the first impurity regions extends under and across the second electrode and the first electrode; and
a plurality of second impurity regions disposed in the substrate and exposed through the second insulative film and the second electrode;
wherein the first electrode, the first insulative film and the plurality of first impurity regions form a pair of antifuses electrically connected in series, and the plurality of first impurity regions, the second electrode, the second insulative film and the plurality of second impurity regions form a pair of transistors electrically coupled to the plurality of antifuses, respectively.

2. The semiconductor device of claim 1, further comprising a plurality of doped extension regions disposed in the substrate and contacting the second insulative film, wherein each of the doped extension regions is separated from an adjacent first impurity region by a channel region.

3. The semiconductor device of claim 2, wherein the channel region has a length, and the plurality of first impurity regions are spaced apart from each other by a distance less than the length.

4. The semiconductor device of claim 3, wherein the first electrode has a width less than the length.

5. The semiconductor device of claim 2, wherein the plurality of first impurity regions and the plurality of doped extension regions have a same doping concentration.

6. The semiconductor device of claim 2, wherein the plurality of first impurity regions, the plurality of second impurity regions, and the plurality of doped extension regions comprise n-type dopant species.

7. The semiconductor device of claim 2, further comprising a plurality of halo implants arranged within the substrate and under the plurality of doped extension regions, respectively.

8. The semiconductor device of claim 7, further comprising an isolation structure arranged within the substrate to define an active area in which the plurality of first impurity regions, the plurality of second impurity regions, the plurality of doped extension regions, and the plurality of halo implants are disposed, wherein the first electrode and second electrode extend across the active area and the isolation structure.

9. The semiconductor device of claim 1, wherein the first insulative film has a first thickness, and the second insulative film has a second thickness greater than the first thickness.

10. The semiconductor device of claim 1, wherein the first insulative film and the second insulative film are thermally-grown silicon dioxide films.

11. The semiconductor device of claim 1, wherein the first electrode has a width, the capping layer attached to the first electrode has a third thickness less than the width, and the second electrode has a fourth thickness less than the width.

12. The semiconductor device of claim 11, wherein the width is about 2 to 3 times the fourth thickness.

13. The semiconductor device of claim 11, wherein the width is in a range of about 30 to 100 nm.

14. The semiconductor device of claim 11, wherein the third thickness is in a range of 2 to 3 nm.

15. The semiconductor device of claim 1, further comprising a plurality of spacers surrounding the second electrode.

16. The semiconductor device of claim 15, further comprising:

a passivation layer covering the plurality of second impurity regions, the spacers and the second electrode;
a plurality of conductive plugs penetrating through the passivation layer and contacting the plurality of second impurity regions, respectively; and
a conductive wire disposed on the passivation layer and contacting the plurality of conductive plugs.

17. The semiconductor device of claim 1, wherein the plurality of first impurity regions have a first doping concentration, and the plurality of second impurity regions have a second doping concentration greater than the first doping concentration.

18. The semiconductor device of claim 1, wherein the plurality of first impurity regions have a first depth, and the plurality of second impurity regions have a second depth greater than the first depth.

19. The semiconductor device of claim 1, wherein the first and second electrodes include doped polysilicon.

* * * * *